US011428661B2

(12) United States Patent
Haubold et al.

(10) Patent No.: US 11,428,661 B2
(45) Date of Patent: Aug. 30, 2022

(54) METHOD FOR PRODUCING A MOISTURE SENSOR AT THE WAFER LEVEL AND MOISTURE SENSOR

(71) Applicant: Infineon Technologies AG, Neubiberg (DE)

(72) Inventors: Marco Haubold, Dresden (DE); Heiko Froehlich, Radebeul (DE); Thoralf Kautzsch, Dresden (DE); Olga Khvostikova, Dresden (DE); Marten Oldsen, Anzing (DE); Bernhard Straub, Neubiberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 343 days.

(21) Appl. No.: 16/692,328

(22) Filed: Nov. 22, 2019

(65) Prior Publication Data
US 2020/0166471 A1  May 28, 2020

(30) Foreign Application Priority Data

Nov. 23, 2018  (DE) .......................... 102018220169

(51) Int. Cl.
| G01N 27/00 | (2006.01) |
| G01N 27/22 | (2006.01) |
| H01L 21/52 | (2006.01) |
| H01L 21/56 | (2006.01) |
| H01L 23/28 | (2006.01) |

(52) U.S. Cl.
CPC ......... *G01N 27/223* (2013.01); *G01N 27/226* (2013.01); *H01L 21/52* (2013.01); *H01L 21/56* (2013.01); *H01L 23/28* (2013.01)

(58) Field of Classification Search
CPC .... G01N 27/223; G01N 27/226; H01L 21/52; H01L 21/56
See application file for complete search history.

(56) References Cited

U.S. PATENT DOCUMENTS

| 8,852,983 | B1* | 10/2014 | Fedder | G01N 27/4141 |
| | | | | 257/253 |
| 2006/0096371 | A1* | 5/2006 | Isogai | G01N 27/223 |
| | | | | 29/595 |
| 2012/0000285 | A1* | 1/2012 | Waga | G01N 27/225 |
| | | | | 29/595 |
| 2014/0026642 | A1* | 1/2014 | O'Connell | G01N 27/223 |
| | | | | 73/31.05 |
| 2016/0077028 | A1* | 3/2016 | Beck | G01N 27/121 |
| | | | | 73/335.05 |

FOREIGN PATENT DOCUMENTS

| DE | 69007872 T2 | 11/1994 |
| EP | 3239681 A1 | 11/2017 |

\* cited by examiner

*Primary Examiner* — Jamel E Williams
(74) *Attorney, Agent, or Firm* — Slater Matsil, LLP

(57) ABSTRACT

In accordance with an embodiment, a method for producing a moisture sensor includes providing a substrate arrangement, applying a sensor structure, applying a first cover layer on the sensor structure, locally removing the planar cover layer arrangement to expose portions of an insulation layer, applying a third cover layer on the exposed portions of the insulation layer, exposing the planar cover layer arrangement covering the sensor structure, and applying a moisture-absorbing layer element on the planar cover layer arrangement covering the sensor structure to obtain the moisture sensor.

23 Claims, 14 Drawing Sheets

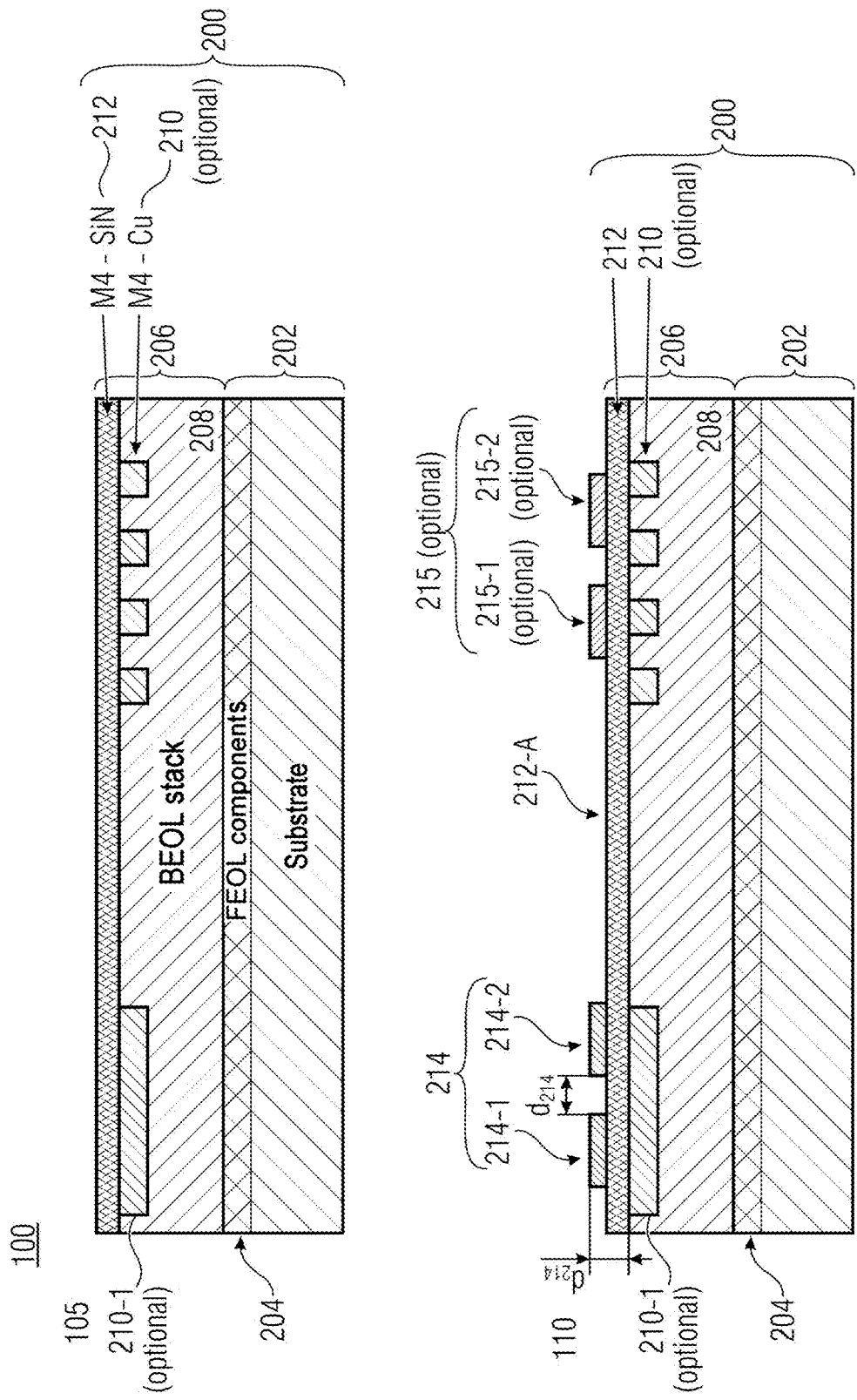
Fig. 1 (Part 1)

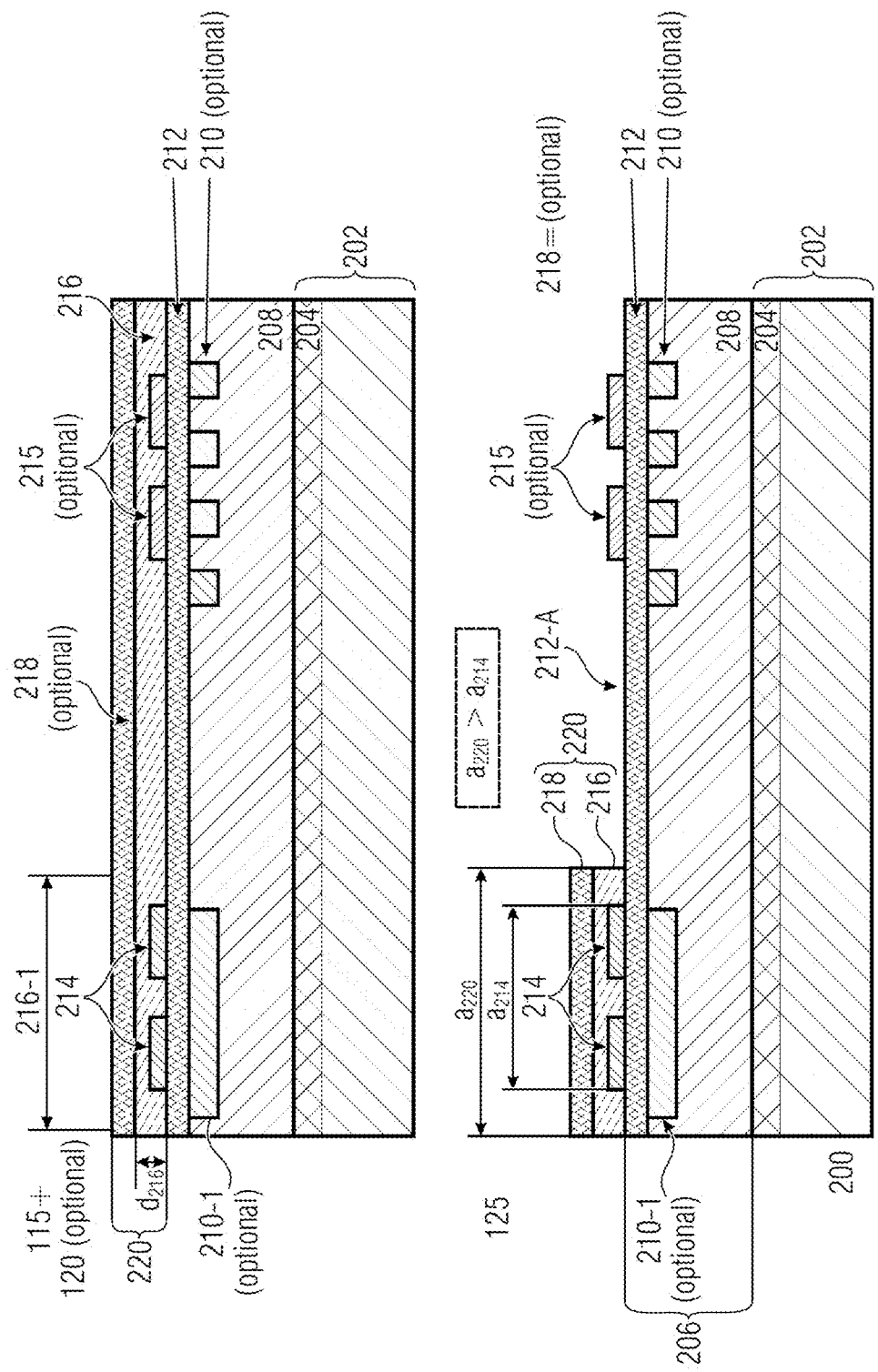
Fig. 1 (Part 2)

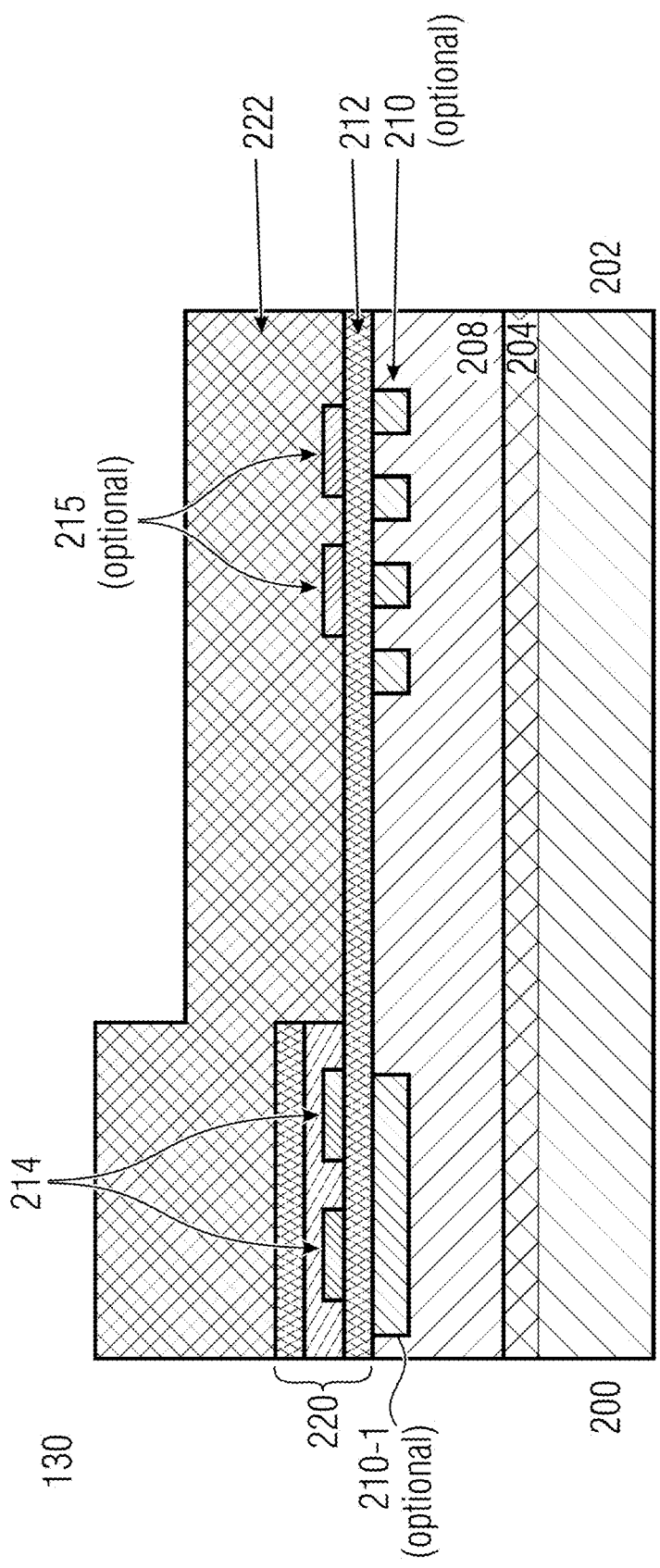
Fig. 1 (Part 3)

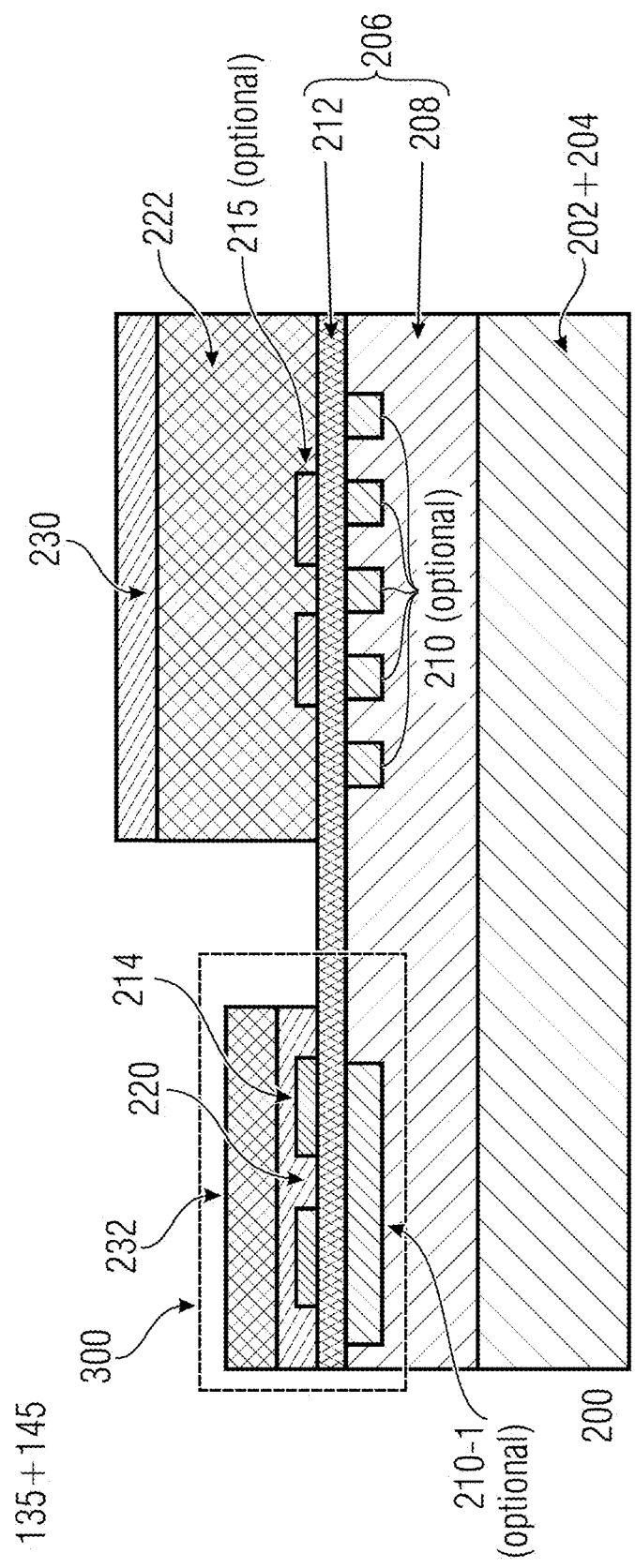
Fig. 1 (Part 4)

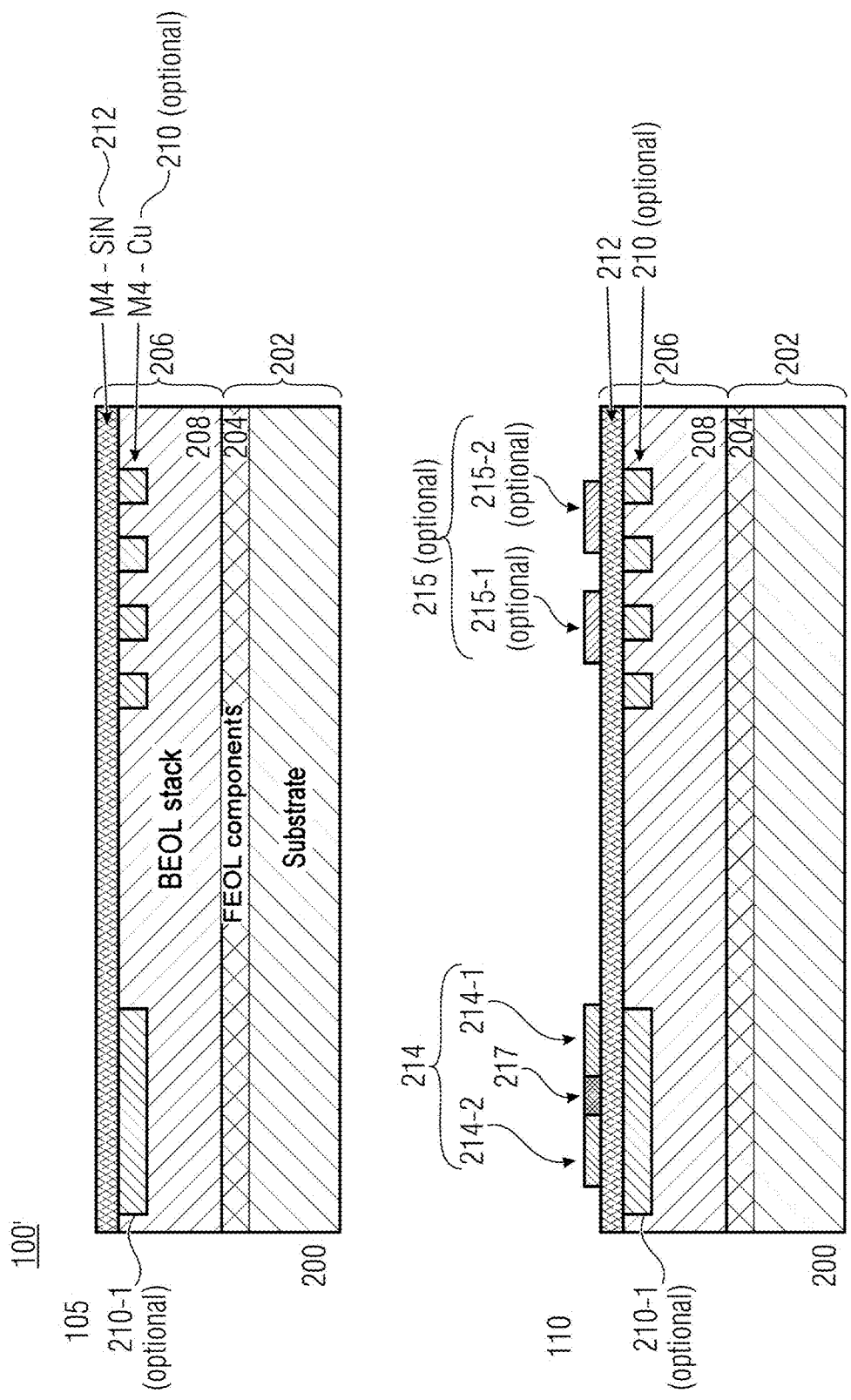
Fig. 2 (Part 1)

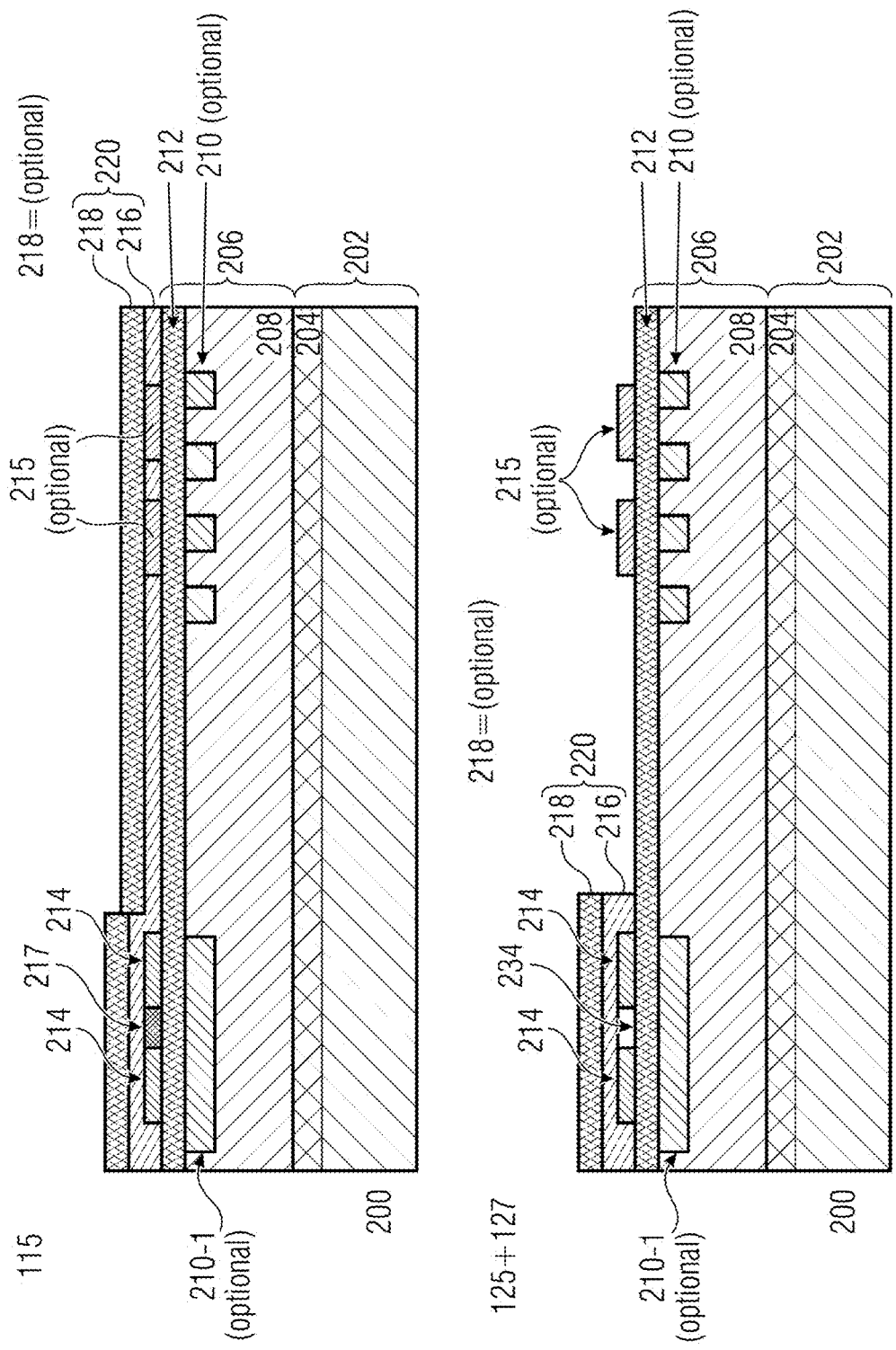
Fig. 2 (Part 2)

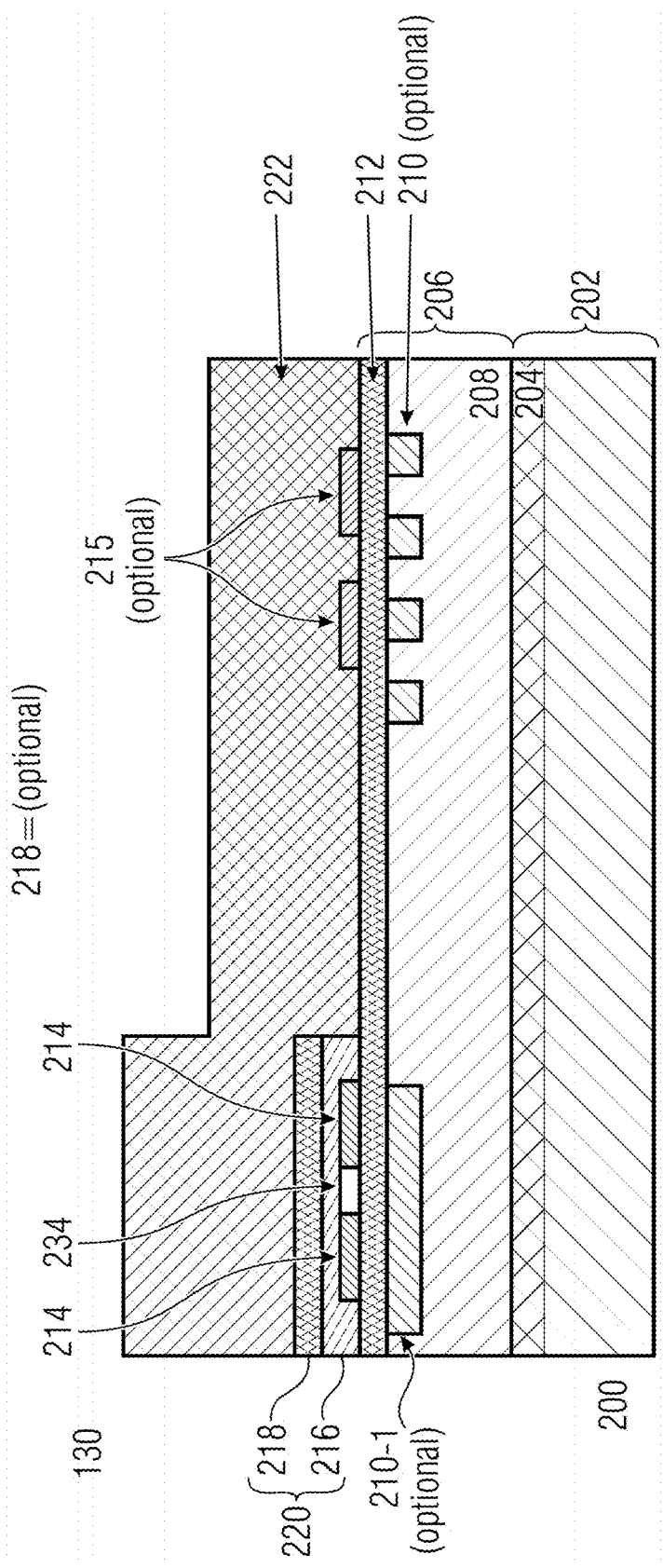
Fig. 2 (Part 3)

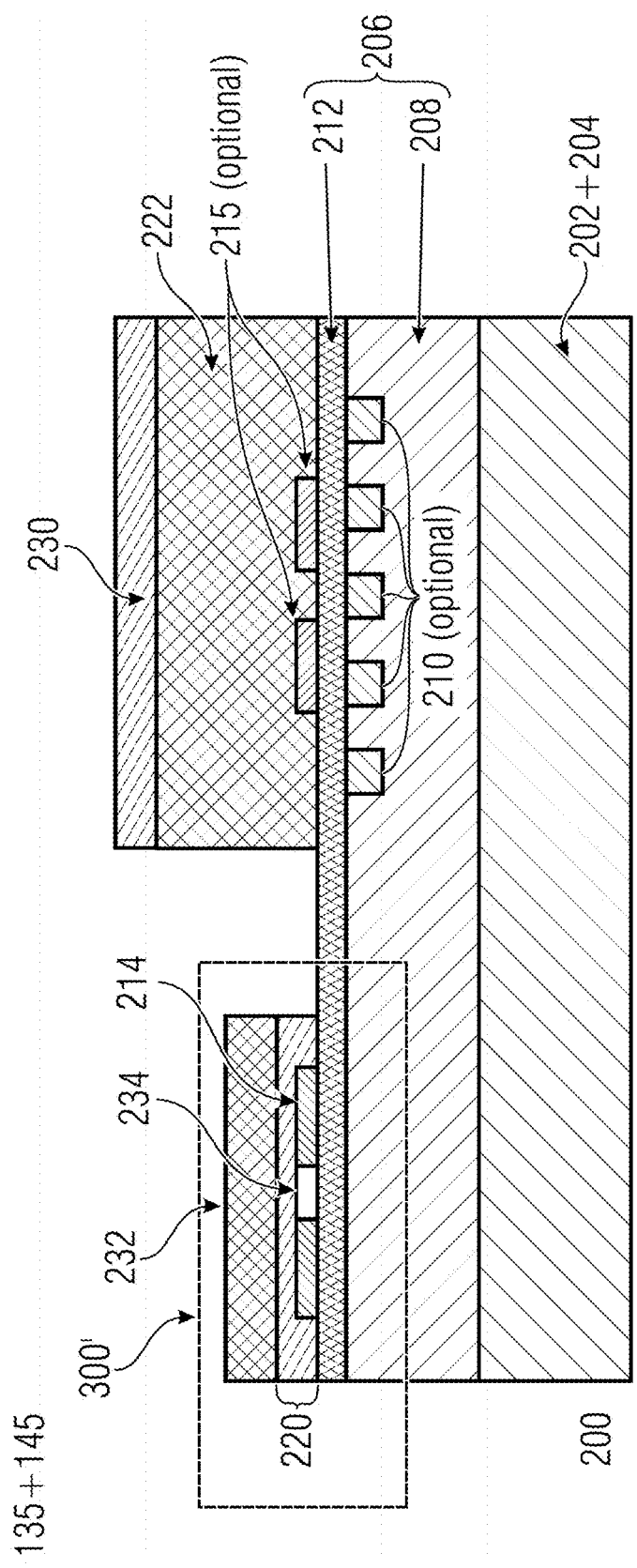
Fig. 2 (Part 4)

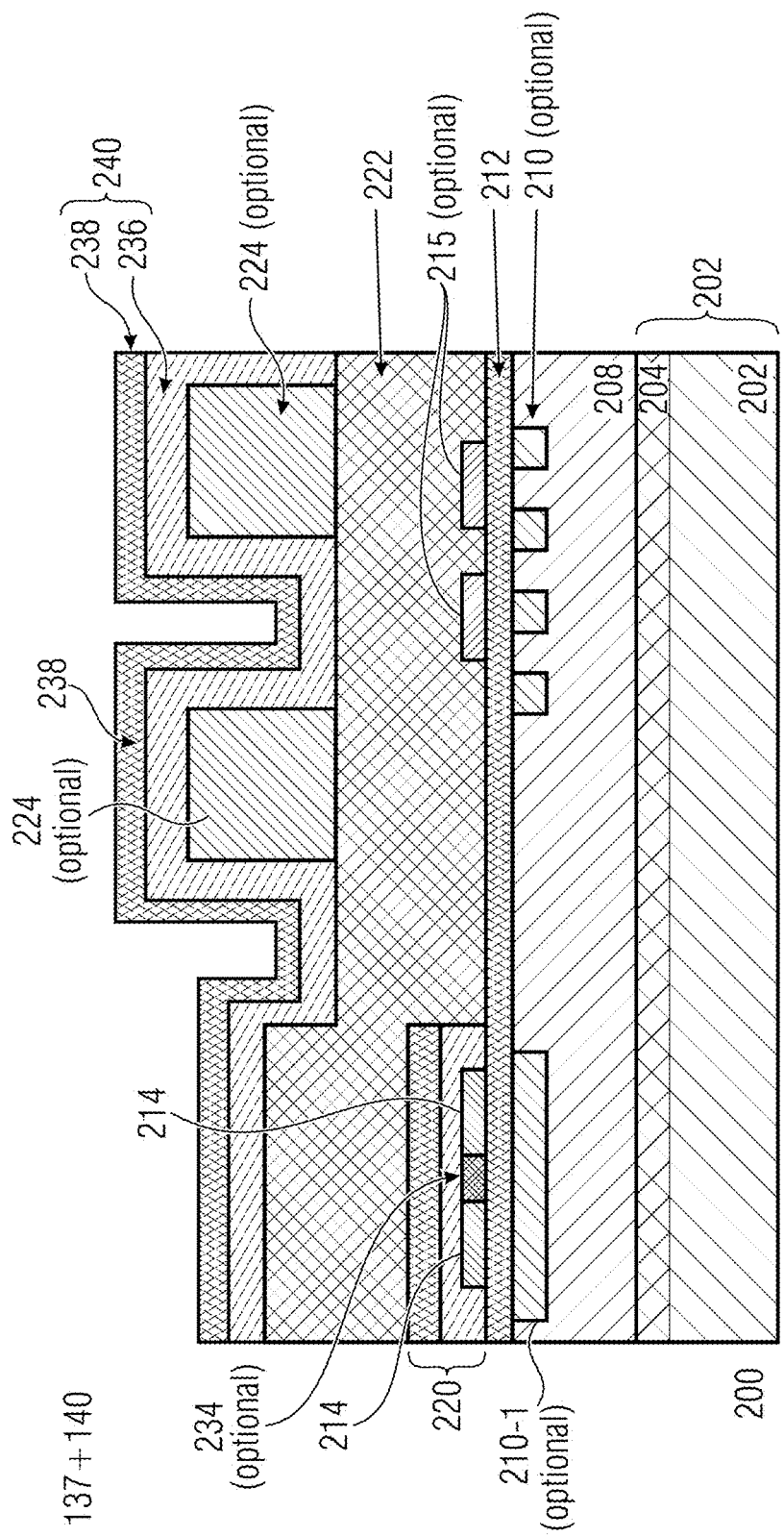
Fig. 3 (Part 1)

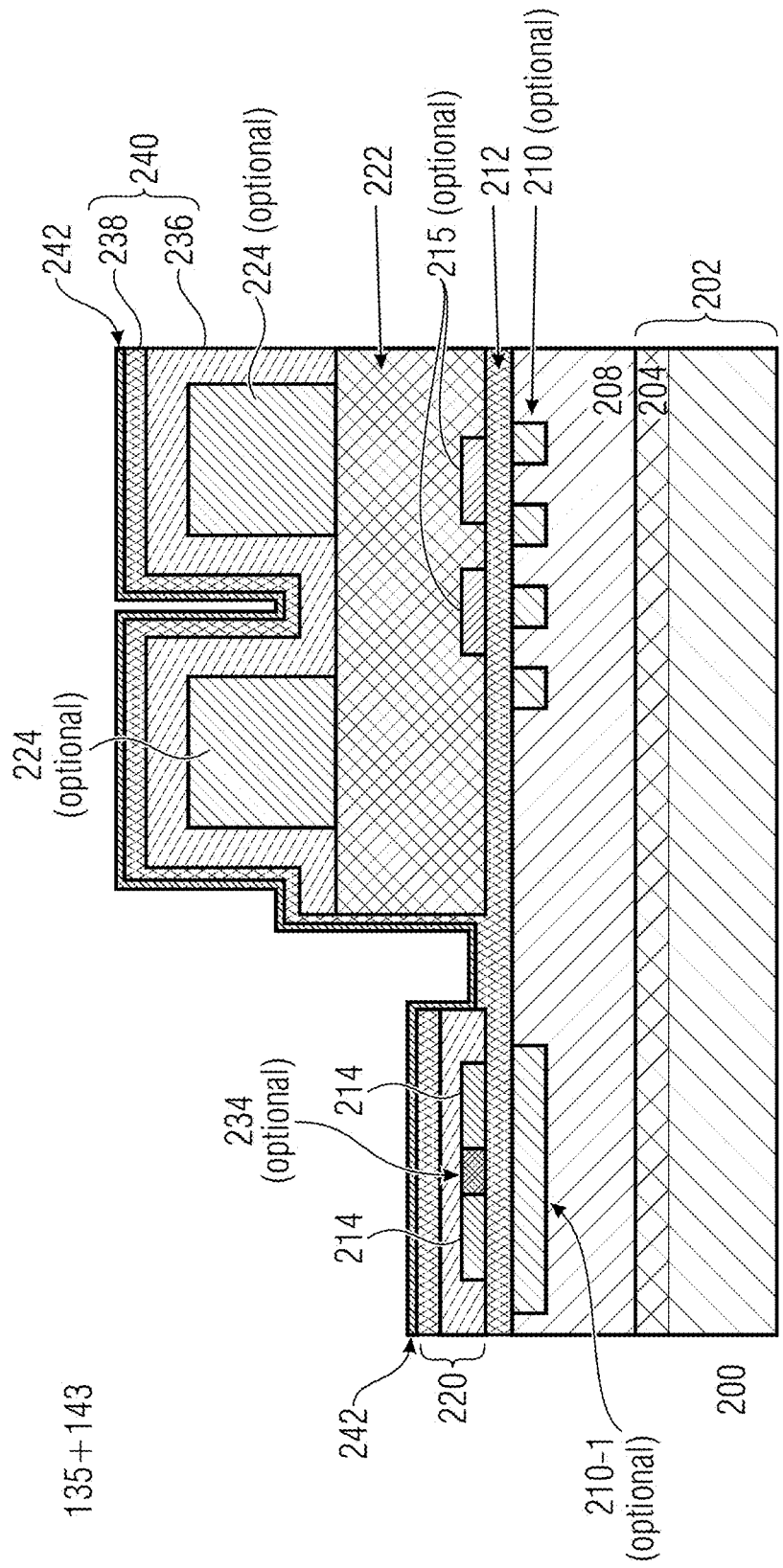
Fig. 3 (Part 2)

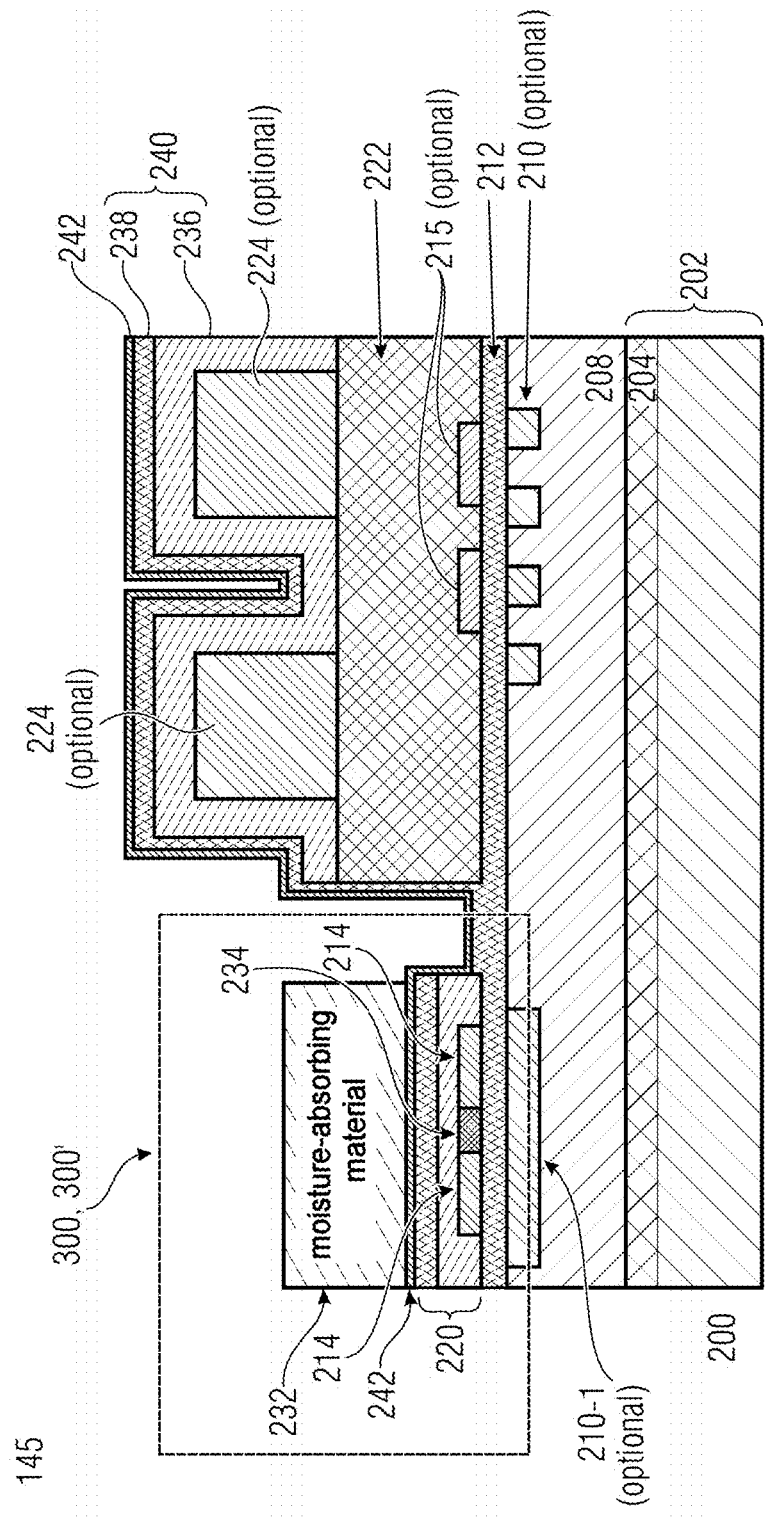
Fig. 3 (Part 3)

METHOD FOR PRODUCING A MOISTURE SENSOR AT THE WAFER LEVEL AND MOISTURE SENSOR

This application claims the benefit of German Patent Application No. 102018220169.2, filed on Nov. 23, 2018 which application is hereby incorporated herein by reference.

TECHNICAL FIELD

Exemplary embodiments relate to a method for producing a moisture sensor at the wafer level and to a corresponding moisture sensor for measuring the moisture in the ambient atmosphere.

BACKGROUND

The recording of environmental and/or ambient parameters in the ambient atmosphere is gaining ever greater importance in the implementation of corresponding sensors inside mobile devices, but also for use in home automation, such as for example smart homes, and for example also in the automobile sector. With the more comprehensive use of sensors, however, there is in particular also a need to be able to produce corresponding sensors as straightforwardly and therefore economically as possible, although the resulting reliability and accuracy of the sensors are nevertheless to be maintained.

In the monitoring of relative humidity in the environment of the sensor, or of the device in which the sensor is installed, the combination of sensor structure and application specific integrated circuits (ASICs) is often problematic in terms of an economical production process flow. This is relevant particularly for electronic consumer devices, since in this case sensors that are as economical as possible to produce, such as for example sensors for measuring relative humidity, are intended to be used.

SUMMARY

A method 100, 100' for producing a moisture sensor 300 at the wafer level comprises the following steps: providing 105 a substrate arrangement 200, which comprises a semiconductor substrate 202, for example with components 204 arranged thereon, and having a metallization layer stack 206 arranged on the semiconductor substrate 202, the metallization layer stack 206 comprising a multiplicity of metallization structures 210, 210-1 embedded in an insulation material 208, an insulation layer 212 being arranged on the metallization layer stack 206; applying no a sensor structure 214 having a multiplicity of conductive sensor structure elements 214-1, 214-2 on the insulation layer 212 of the metallization layer stack 206; applying 115 a first cover layer 216 on the sensor structure 214 and uncovered sections of the insulation layer 212, the first cover layer 216 covering the conductive sensor structure 214, and a section, covering the conductive sensor structure 214, of the first cover layer 216 being configured in a planar fashion in order to form a planar cover layer arrangement 220; locally removing 125 the planar cover layer arrangement 220, the sensor structure 214 remaining covered with the planar cover layer arrangement 220; applying 130 a third cover layer 222 on the exposed insulation layer 212 and the planar cover layer stack 220 covering the sensor structure 214; exposing 135 the planar cover layer stack 220 covering the sensor structure 214; and applying 145 a moisture-absorbing layer element 232 on the planar cover layer stack 220 covering the sensor structure in order to obtain the moisture sensor 300.

According to one exemplary embodiment, the method 100 furthermore comprises the following step: applying 120 a second cover layer 218 on the planar first cover layer 216, in order to obtain the planar cover layer arrangement 220 as a planar cover layer stack 220 having the first and second cover layers 216, 218 on the sensor structure 214.

According to one exemplary embodiment, the method 100 furthermore comprises the following step: planarizing the first cover layer, in order to form in a planar fashion at least the section 216-1, covering the sensor structure 214, of the first cover layer 216.

According to one exemplary embodiment, the method 100' furthermore comprises the following step: arranging a sacrificial layer structure 217 between the neighboring sensor structure elements 214-1, 214-2 of the sensor structure 214 after the application of the first cover layer 216, in order to obtain a cavity region 234 between the neighboring sensor structure elements 214-1, 214-2 of the sensor structure 214.

According to one exemplary embodiment, the method 100, 100' furthermore comprises the following step: applying 140 a passivation layer arrangement, on the planar cover layer arrangement covering the sensor structure 214, the step 135 of exposing the planar cover layer arrangement covering the sensor layer structure 214 being carried out through the passivation layer arrangement and the third cover layer 222.

According to one exemplary embodiment, during the application 110 of the sensor structure 214 having a multiplicity of conductive sensor structure elements 214-1, 214-2, a reference electrode structure 215 having a multiplicity of conductive reference structure elements 215-1, 215-2 is furthermore applied on the insulation layer 212.

According to one exemplary embodiment, the reference electrode structure 215 is embedded in the third cover layer after the application of the third cover layer.

According to one exemplary embodiment, the reference electrode structure 215 is formed as a metallization structure embedded in the metallization layer stack.

According to one exemplary embodiment, the metallization layer stack 206 comprises next to the sensor structure 214 a metallization structure 210-1, which is configured as a shielding element for the sensor structure 214 in order to reduce a parasitic capacitance.

According to one exemplary embodiment, the method 100 furthermore comprises the following step after the application of the third cover layer 222: applying further insulation layer structures, metallization layer structures and/or component structures on one another or on the third cover layer 222.

According to one exemplary embodiment, during the step of applying further insulation structures, metallization layer structures and/or component structures, a rewiring layer, an insulation layer, an uppermost metallization layer and/or a passivation layer arrangement are applied and structured in such a way that the planar cover layer arrangement 220 covering the sensor structure 214 is exposed.

According to one exemplary embodiment, the moisture-absorbing layer element 232 comprises a polymer material.

According to one exemplary embodiment, the sensor structure elements 214-1, 214-2 of the sensor structure 214 comprise copper or aluminum with a thickness of ≤500 nm or about 200 nm and a lateral spacing of about 100 nm.

According to one exemplary embodiment, the sensor structure elements 214-1, 214-2 are arranged in an interdigital arrangement with respect to one another.

According to one exemplary embodiment, the components 204 arranged on the semiconductor substrate 202 are formed during an FEOL treatment process of the semiconductor substrate 202.

According to one exemplary embodiment, the FEOL components comprise components based on CMOS technology.

According to one exemplary embodiment, the metallization layer stack 206 is formed during a BEOL treatment process of the substrate arrangement 200.

According to one exemplary embodiment, the metallization layer stack 206 comprises a multiplicity of conductive track structures 210 in different planes M #. in the insulation material 208.

A moisture sensor 300, 300' comprises a substrate arrangement 200, which comprises a semiconductor substrate 202 with components 204 arranged thereon, and a metallization layer stack 206 arranged on the semiconductor substrate 202, the metallization layer stack 206 comprising a multiplicity of metallization structures embedded in an insulation material 208, an insulation layer 212 being arranged on the metallization layer stack 206 of the substrate arrangement 200; a sensor structure 214 having a multiplicity of conductive sensor structure elements 214-1, 214-2 on the insulation layer 212 of the metallization layer stack 206, a planar cover layer arrangement 220 being arranged on the sensor structure 214; and a moisture-absorbing layer element 232 on the planar cover layer arrangement 220 covering the sensor structure 214.

BRIEF DESCRIPTION OF THE DRAWINGS

Preferred exemplary embodiments of the present concept for the production of a moisture sensor at the wafer level are explained in more detail below with the reference to the appended drawings, in which:

FIG. 1 shows a basic sequence diagram of a method or process sequence for the production of a moisture sensor at the wafer level according to one exemplary embodiment;

FIG. 2 shows a basic sequence diagram of the method steps of a method, or of a process, for the production of a moisture sensor at the wafer level according to a further exemplary embodiment;

FIG. 3 shows further optional method steps of the method 100, 100' according to a further exemplary embodiment;

DETAILED DESCRIPTION OF ILLUSTRATIVE EMBODIMENTS

Figure 4A:
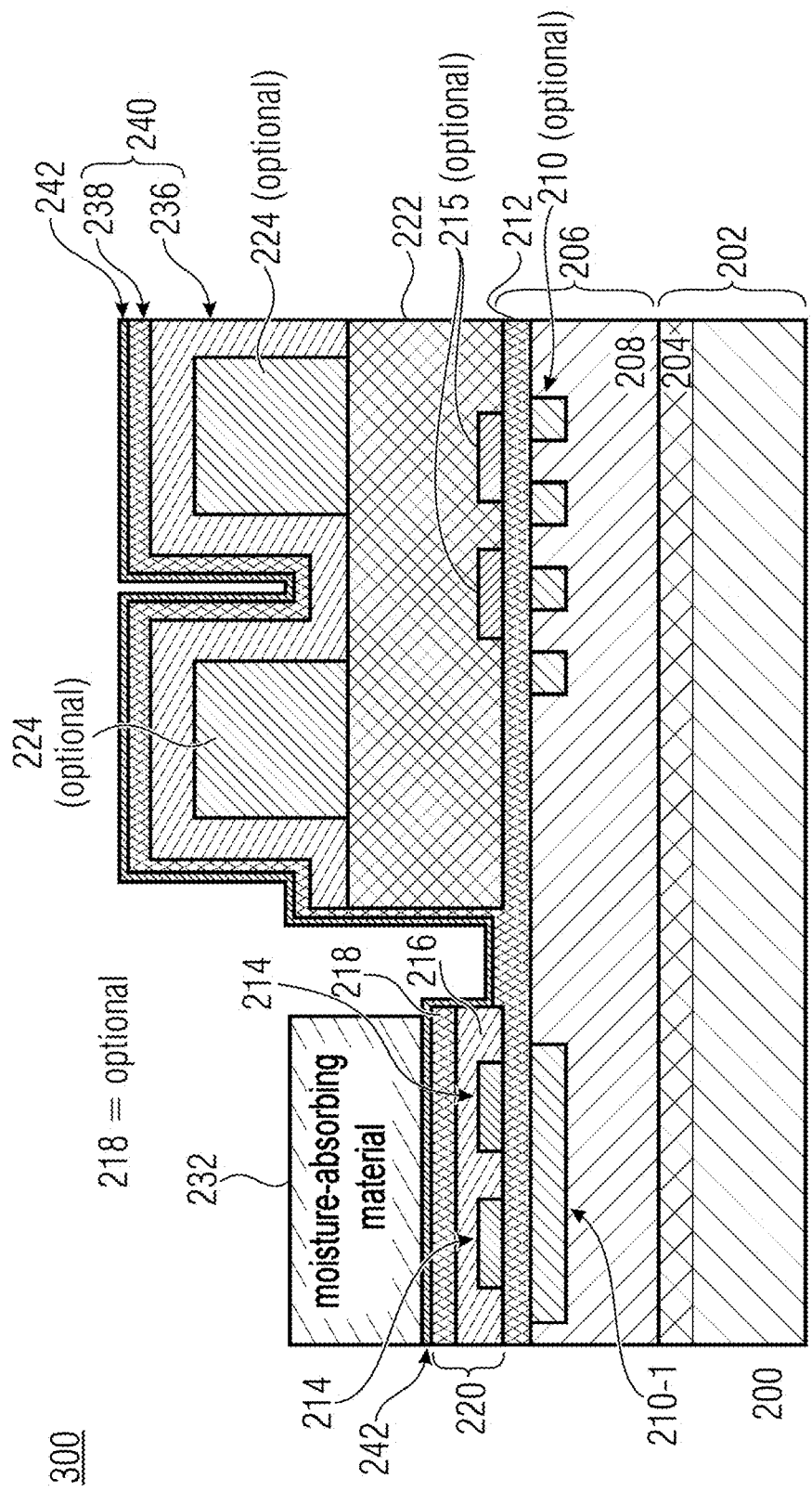
FIGS. 4a-4b show basic, schematic cross-sectional representations of a moisture sensor according to one exemplary embodiment.

Before exemplary embodiments of the present concept are explained in more detail below with the aid of the drawings, it is pointed out that elements, objects, functional units and/or method steps which are identical, functionally equivalent or have the same effect in the various figures are provided with the same references, so that the description of these elements, objects, functional units and/or method steps presented in different exemplary embodiments is mutually interchangeable and/or may be applied to one another.

Various embodiments are directed an effective production of moisture sensors. Various embodiment moisture sensors can be integrated in a straightforward manner into existing semiconductor wafer treatment processes with which reliably and accurately operating humidity sensors can be obtained.

A basic sequence or flow diagram of a method 100 for producing a moisture sensor 300 at the wafer level according to one exemplary embodiment will now be described below with reference to FIG. 1.

First, a substrate arrangement 200 is now provided in FIG. 1 in the production method 100 at step 105. The substrate arrangement 200 comprises a semiconductor substrate 202 having for example components 204 arranged thereon, such as for example active or passive semiconductor components, and furthermore a metallization layer stack 206 arranged on the semiconductor substrate 202. The metallization layer stack 206 comprises for example a multiplicity of metallization structures 210 embedded in an insulation material 208, an insulation layer 212, for example of a dielectric material, being arranged, for example as the uppermost layer, on the metallization layer stack 206.

The semiconductor substrate 202 may for example be a semiconductor wafer processed in an FEOL process (FEOL=front end of line), such as for example a silicon wafer having an integrated circuit arrangement or ASIC (ASIC=application specific integrated circuit), or in general having CMOS components, on which the metallization layer stack or wiring layer stack 206 is applied in a BEOL process (BEOL=back end of line). The metallization or wiring layer stack 206 is, for example, provided in order to provide wiring planes for the FEOL components 204, i.e. to provide predetermined connections between FEOL components and/or connections to pad contacts on the upper side of the metallization layer stack 206.

The metallization structures 210 embedded in the insulation material 208 comprise for example a metal or metal alloy material, such as for example copper, aluminum, etc. The insulation layer 212 comprises for example a dielectric material, such as for example silicon nitride SiN. In FIG. 1, the embedded metallization structures 210 are denoted for example by $M_4$ as the fourth and uppermost metal level of the metallization layer stack 206.

In step 110, a conductive sensor structure 214 having a multiplicity of sensor structure elements 214-1, 214-2 is now applied on the insulation layer 212 of the metallization layer stack 206. The sensor structure elements 214-1, 214-2 may be arranged in a so-called interdigital arrangement with respect to one another, which may for example be read out capacitively. The sensor structure elements 214-1, 214-2 of the conductive sensor structure 214 comprise for example a metal or a metal alloy, such as for example copper, aluminum, etc. The sensor structure elements 214-1, 214-2 have, for example, a thickness of ≤500 nm or about 200 nm. For example, the sensor structure elements 214-1, 214-2 may have a thickness $d_{214}$ (vertically with respect to a plane of the main surface region of the insulation layer 212) in a range of from 100 nm to 500 nm, from 150 nm to 250 nm, or of about 200 nm. Furthermore, the sensor structure elements 214-1, 214-2 may be laterally separated with a spacing $a_{214}$ of about 50 nm to 150 nm or of about 100 nm (with respect to the plane of the main surface region 212-A of the insulation layer 212).

As is furthermore represented by way of example in step 110, in the metallization layer stack 206 there may be arranged next to (=below in FIG. 1) the conductive sensor structure 214 in the insulation material 208, opposite to the sensor structure 214, an optional metallization layer structure 210-1, which may be configured as a shielding element for the sensor structure 214 in order to reduce a parasitic capacitance $C_{PAR}$.

The conductive sensor structure 214 may for example comprise a metal, such as for example aluminum, or a metal alloy, aluminum for example also being used as the material for a redistribution layer and/or as the material for contact pads (=pad material) for current CMOS technologies.

In step 115, a first cover layer (=passivation layer) 216 is now applied onto the sensor structure 214 and the uncovered regions of the insulation layer 212 of the metallization layer stack 206. The first cover layer 216 in this case covers the sensor structure 214, a section 216-1, covering the sensor structure 214, of the first cover layer 216 being configured in planar or (as far as possible) topology-free fashion.

To configure at least the section 216-1, covering the sensor structure 214, of the first cover layer 216 in a planar fashion, the first cover layer 216 is planarized, in which case a corresponding planarization process may be carried out by means of a CMP process (CMP=chemical-mechanical polishing).

In semiconductor production processes, chemical-mechanical polishing, or chemical-mechanical planarization, refers to a polishing method in wafer treatment in order to erode thin layers uniformly, i.e. to obtain a maximally planar or topology-free surface thereof.

The first cover layer 216 is applied, for example as silicon dioxide material (SiO$_2$) or as silicon nitride material (Si$_3$N$_4$), onto the conductive sensor structure 214 and further uncovered regions of the insulation layer 212 on the substrate arrangement 200, and subsequently planarized, for example by means of a CMP process or another planarization process, in order to obtain a maximally planar or topology-free surface region 216-1 of the first cover layer 216. The final thickness $d_{216}$ (after the planarization process) of the first cover layer 216 is greater, for example by a factor of from 1.5 to 2.5, than the thickness $d_{214}$ of the electrically conductive sensor structure elements (detection electrodes) 214-1, 214-2 of the electrically conductive sensor structure 214.

In an optional step 120, a second cover layer 218 may now be applied on the planar or planarized first cover layer 216 in order to obtain a planar cover layer stack or a planar layer arrangement 220 on the conductive sensor structure 214 and further, or the remaining, regions of the insulation layer 212.

As the following comments will also show, the optionally applied second cover layer 218 may be effective as a thin etch stop layer during one of the subsequent process steps. The second cover layer 218 comprises for example a dielectric material, such as for example silicon nitride (Si$_3$N$_4$).

Since the second cover layer 218 is only applied optionally on the planar or planarized first cover layer 216, for example if this is advantageous or necessary in terms of process technology, according to one exemplary embodiment the planar cover layer arrangement 220 may comprise the planar or planarized first cover layer 216 and, according to a further exemplary embodiment, it may comprise the planar or planarized first cover layer 216 and the second cover layer 218 applied thereon as a planar cover layer stack (220).

In step 125, the planar cover layer arrangement 220 having the first and optionally the second cover layer 216, 218 is locally removed, the conductive sensor structure 214 remaining covered with the planar cover layer arrangement 220. The planar cover layer arrangement 220 has a width $a_{220}$ (parallel to the plane of the main surface region 212-A of the first insulation layer 212) which is, for example, greater than the width $a_{214}$ of the electrically conductive sensor structure 214. The planar cover layer stack 220 is therefore configured in order to cover the sensor structures as well. For the signal generation, the stray capacitance of the electrodes is used by this special construction. The latter changes as a function of the moisture.

In step 130, a third cover layer (=further passivation layer) 222 is applied onto the uncovered or exposed sections or surface regions of the insulation layer 112, and furthermore onto the planar cover layer arrangement 220 having the electrically conductive sensor structure 214 embedded therein. The third cover layer 222 may for example comprise a dielectric material, such as for example a silicon dioxide material SiO$_2$ having a thickness in a range of from 500 nm to 1500 nm, or of about 1000 nm.

In step 135, the planar cover layer arrangement 220 covering the sensor structure 214 is now exposed through the third cover layer (=further passivation layer) 222, in which case, for example, the optional layer 218 of the layer arrangement 220 may be configured as an etch stop layer for the exposure step 135, carried out by means of an etching process, of the planar cover layer stack 220 covering the sensor structure 214.

According to further optional exemplary embodiments, further insulation structures, metallization layer structures and/or component structures may be arranged on one another, or on the fourth cover layer, after the step 130 of applying the third cover layer 222. Thus, for example, in the optional step of applying further insulation layer structures, metallization layer structures and/or component structures on the third cover layer 222, a redistribution layer, one or more further insulation layers, an uppermost metallization layer and/or at least one passivation layer may be applied and (subsequently, for example in step 135) structured in such a way that the planar cover layer arrangement 220 covering the sensor structure is uncovered. The optional further insulation structures, metallization layer structures and/or component structures are thus applied and structured in such a way that they are removed at the location of the moisture sensor 300, i.e. above the cover layer arrangement 220, and expose to the environment the planar cover layer arrangement 220 covering the conductive sensor structure 214.

In an optional step 140 (not shown in FIG. 1), an optional passivation layer arrangement 230 having one or more passivation layers may be applied onto the exposed planar cover layer arrangement 220 covering the conductive sensor structure 214, and furthermore onto further uncovered surface regions of the substrate arrangement 200.

In a step 145, a moisture-absorbing layer element 232 is applied on the planar cover layer arrangement 220 covering the conductive sensor structure, in order to obtain the moisture sensor 300.

According to one exemplary embodiment of the present concept 100 for producing the moisture sensor 300 at the wafer level, the moisture-absorbing material 232 is applied after the concluding treatment of the substrate arrangement 200. The moisture-absorbing layer structure 232 may for example comprise a moisture-absorbing material, such as for example a material based on a polymer, such as for example photoimide, SU-8, silicone etc., this list of materials being intended to be regarded only as exemplary and not as exhaustive.

The moisture-absorbing material 232 may optionally be structured and removed outside the desired moisture sensor element 300.

For the moisture detection, for example, the change in the capacitance of the sensor electrodes 214-1, 214-2 caused by the applied stray electric field as a function of the moisture content inside the moisture-absorbing material 232 is used.

A basic sequence diagram of a method or a process 100' for producing a moisture sensor 300' at the wafer level according to a further exemplary embodiment will now be described below on the basis of FIG. 2.

The following comments refer essentially to the method steps differing from FIG. 1, the other comments in relation to the method 100 of FIG. 1 being similarly applicable to the method 100' of FIG. 2.

As is represented in step 105 of the method 100', the substrate arrangement 200 is again provided. The substrate arrangement 200 again comprises a semiconductor substrate 202 having for example components 204 arranged thereon, such as for example active or passive semiconductor components, and furthermore a metallization layer stack 206 arranged on the semiconductor substrate 202. The metallization layer stack 206 comprises for example a multiplicity of metallization structures 210 embedded in an insulation material 208, an insulation layer 212, for example of a dielectric material, being arranged, for example as the uppermost layer, on the metallization layer stack 206.

In step no, a conductive sensor structure 214 having a multiplicity of sensor structure elements 214-1, 214-2 is applied on the insulation layer 212 of the metallization layer stack 206. Furthermore, in step no (before the step of applying the first cover layer 216 on the conductive sensor structure 214), a sacrificial layer or a sacrificial layer structure 217 is arranged between neighboring sensor structure elements 214-1, 214-2 of the conductive sensor structure 214. The arranging of the sacrificial layer structure 217 between neighboring sensor structure elements 214-1, 214-2 may, for example, be carried out according to two different process options.

According to a first optional process option, the conductive sensor structure 214 having the multiplicity of sensor structure elements 214-1, 214-2 may initially be applied on the insulation layer 212, whereupon the sacrificial layer structure 217 is arranged between the neighboring sensor structure elements 214-1, 214-2, to this end the sacrificial layer 217 being for example applied onto the desired regions and, for example, a polishing process, for example a CMP process, subsequently being carried out in order to configure the sacrificial layer structure 217 flush with the height $d_{214}$ of the conductive sensor structure 214.

According to a second optional process optional, the sacrificial layer 217 may initially be applied and structured, whereupon the conductive sensor structure 214 having the multiplicity of sensor structure elements 214-1, 214-2 is arranged adjacent to the sacrificial layer structure 217, so that the sacrificial layer structure 217 is arranged between the neighboring sensor structure elements 214-1, 214-2 of the conductive sensor structure 214. Subsequently, a planarization or polishing step, for example a CMP method, may in turn be carried out in order to obtain a flush configuration of the sacrificial layer structure 217 and of the conductive sensor structure 214 having the thickness $d_{214}$.

According to the exemplary embodiment represented in FIG. 2 of the method 100' for producing the moisture sensor 300, the conductive sensor structure 214 therefore comprises the sacrificial layer structure 217 arranged between the multiplicity of sensor structure elements 214-1, 214-2.

In step 115, the first cover layer (=passivation layer) 216 is again arranged on the conductive sensor structure 214 having the sacrificial layer structure 217 arranged there and on the insulation layer 212 of the metallization layer stack 206, the first cover layer or passivation layer 216 covering the conductive sensor structure 214, and the section 216-1, covering the sensor structure 214, of the first cover layer being configured in a planar fashion. Now, in step 120, the second cover layer (=etch stop layer) 218 is in turn applied onto the planar first cover layer 216 in order to obtain the cover layer arrangement 220 on the sensor structure 214, the section 220-1, covering the sensor structure 214, of the cover layer arrangement 220 again being configured in a planar fashion. This is achieved since the sacrificial layer structure 217 arranged between neighboring sensor structure elements 214-1, 214-2 forms a flush, or planar, surface with the conductive sensor structure 214.

According to one exemplary embodiment, the cover layer arrangement 220 may comprise next to the planar section 220-1 of the cover layer arrangement 220 on the sensor structure 214 a step or a transition, which is based on the step existing between the insulation layer 112 and the conductive sensor structure 114 applied thereon with the sacrificial layer 217 arranged therebetween.

In step 125, the first and second cover layers 216, 218 are in turn locally removed, the sensor structure 214 having the planar section 220-1 of the cover layer arrangement 220 remaining covered.

In step 127, the sacrificial layer structure 217 is now at least partially or even fully removed between the neighboring sensor structure elements 214-1, 214-2 of the sensor structure 214, in order to obtain cavities or free spaces 234 between the neighboring sensor structure elements 214-1, 214-2 of the conductive sensor structure 214.

The further method steps 130, 135, 140 (optional) and 145 of FIG. 1 may be carried out likewise after step 127 of FIG. 2.

Further exemplary embodiments of the method 100, 100' for producing a moisture sensor 300 at the wafer level will now be discussed below.

Furthermore, further optional method or process steps of the method 100, 100' or optional supplements to the method steps of the method 100, 100' are represented by way of example in FIGS. 1 and 2.

Thus, in the production method 100, 100', in step 110 of applying the conductive sensor structure 214 having the multiplicity of sensor structure elements 214-1, 214-2 on the insulation layer 212, an optional reference electrode structure 215 having a multiplicity of reference electrode elements 215-1, 215-2 may furthermore be applied on the insulation layer 212. According to one exemplary embodiment, the reference electrode structure 215 is embedded in the third cover layer 222 during the application of the third cover layer 222 (and remains embedded therein).

According to one exemplary embodiment of the method 100, 100', both the conductive sensor structure 214, which is sensitive to a moisture change, and the reference electrode structure 215, which is insensitive to a moisture change because of being accommodated in the "thick" third cover layer 222, may thus be produced inside the same production process module, for example after the standard CMOS metallization process and before the pad fabrication module. According to one exemplary embodiment, the reference electrodes 215-1, 215-2 of the reference electrode structure 215 are therefore covered by, or embedded in, the third cover layer 222, which is for example configured as a thick passivation layer comprising a silicon dioxide material having a thickness of about 1000 nm, in order to prevent or suppress moisture sensitivity of the reference electrode structure 215. The third cover layer 222 may be configured as a cover layer arrangement or passivation layer arrangement, for example having a multiplicity of different insulation layers, such as for example a silicon dioxide layer $SiO_2$ and a silicon nitride layer $Si_3N_4$ (for example as a stack), or a single passivation or cover layer 222 or also from a single passivation layer comprising a silicon dioxide material $SiO_2$ or a silicon nitride material $Si_3N_4$, in which case, for example, a final cover layer or a concluding cover layer stack may furthermore also be provided on the third cover layer 222.

According to one exemplary embodiment, the two electrode structures, i.e. the measuring electrode structure 214 and the reference electrode structure 215, may therefore also be produced at different successive times and/or during different process steps in the overall process flow.

The optional reference electrode structure 215 is shown by way of example in FIGS. 1 and 2.

According to a further exemplary embodiment, as an alternative or in addition to the reference electrode structure 215, a reference electrode structure 210 may also be configured as a metallization structure 210 embedded in the metallization layer stack 206. As is represented by way of example in FIGS. 1 and 2 of the method 100, 100', the optional reference electrode structure 210 may, for example, be formed in the uppermost metallization plane $M_4$ (=metallization plane 4) of the metallization layer stack 206 and, for example, comprise copper, aluminum, etc. or another metal, or another metal alloy, as the conductive material.

According to one exemplary embodiment, the metallization layer stack 206 may furthermore comprise, adjacent to the conductive sensor structure, for example in the metallization plane $M_4$, an optional metallization layer structure 210-1 which is configured as an electrostatic shielding element for the sensor structure 214 in order to reduce the parasitic capacitance CPAR of the sensor structure 214.

Further optional exemplary method steps of the method 100, 100', which may be equally applied both to the production method 100 represented in FIG. 1 and to the production method 100' represented in FIG. 2, will now be presented below with the aid of FIG. 3.

According to one exemplary embodiment, after the step 130 of applying the third cover layer 222, further insulation layer structures, metallization layer structures and/or component structures may furthermore be applied in a structured fashion on one another or on the fourth cover layer 222.

As is now represented in FIG. 3 in step 137, optional metallization regions 224 made of a metal or a metal alloy, such as for example aluminum, may for example be applied. These additional metallization structures 224 may, for example, have a thickness in a range of from 1000 nm to 1500 nm and, for instance, of 1200 nm.

In step "140", an upper passivation layer arrangement 230 may furthermore now be applied onto the further insulation structures, metallization structures and/or component structures applied in step 137, such as for example the optional metallization structures 224, onto the uncovered main surface region of the substrate arrangement 200, i.e. onto the uncovered process surface of the substrate arrangement 200, the passivation layer arrangement 230 covering the applied further insulation layer structures, metallization structures and/or component structures on the third cover layer 222 as well as the uncovered sections or surface regions of the third cover layer 222. The upper passivation layer arrangement 230 may for example comprise a first passivation layer 236, such as for example a silicon dioxide material $SiO_2$ with a thickness of between 300 and 600 nm, and of about 450 nm, and a second passivation layer 238 arranged thereover, such as for example comprising a silicon nitride material $Si_3N_4$, with a thickness of between 300 and 500 nm, and of about 400 nm.

In step 135, the planar cover layer arrangement 220 covering the sensor structure 214 is now exposed, in which case the optional layer 218 of the layer stack 220 may be configured for example as an etch stop layer for the exposing step 135, carried out by means of an etching process, of the planar cover layer stack 220 covering the sensor structure 214.

In a step 143, a further passivation layer 242, which comprises for example a silicon nitride material $Si_3N_4$ with a thickness of between 30 and 100 nm, and of about 50 nm, may now optionally be applied onto the remaining process surface of the substrate arrangement 200. The optional further passivation layer 242 may, for example, be arranged also on the planar cover layer arrangement 220 covering the conductive sensor structure 214.

In step 145, a moisture-absorbing layer element 232 is applied on the planar cover layer arrangement 220 covering the conductive sensor structure and on the optional further passivation layer 242, in order to obtain the moisture sensor 300, 300'.

According to one exemplary embodiment, the components 204, for example CMOS components, arranged on the semiconductor substrate may be formed during an FEOL treatment process of the semiconductor substrate 202. The FEOL components 204 can comprise active and/or passive components based on CMOS technology.

According to one exemplary embodiment, the metallization layer stack 206 may be formed during a BEOL treatment process of the substrate arrangement 200. According to one exemplary embodiment, the metallization layer stack 206 comprises a multiplicity of conductive track structures 210, 210a, 210b etc. in different planes in the insulation material 208.

A moisture sensor 300, 300' according to one exemplary embodiment will now be described below with the aid of FIGS. 4a and 4b in a basic, or schematic, cross-sectional representation.

Figure 4B:
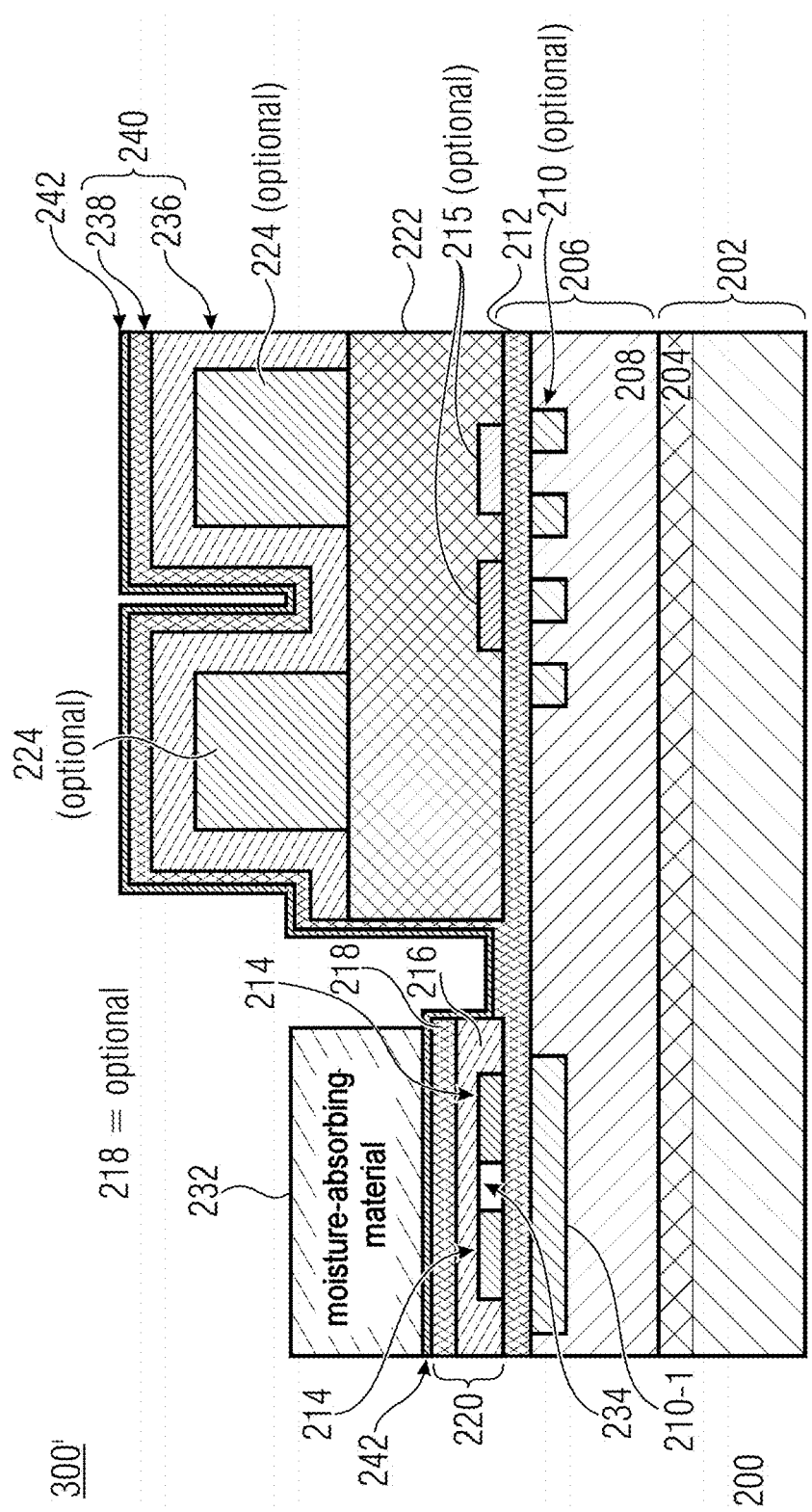

As is represented by way of example in FIGS. 4a and 4b, the moisture sensor 300, 300' comprises a substrate arrangement 200, which comprises a semiconductor substrate 202 with components 204 arranged thereon, and a metallization layer stack 206 arranged on the semiconductor substrate 202, the metallization layer stack 206 comprising a multiplicity of metallization structures embedded in an insulation material 208, and an insulation layer 212 being arranged on the metallization layer stack 206 of the substrate arrangement 200.

The moisture sensor 300, 300' furthermore comprises a sensor structure 214 having a multiplicity of conductive sensor structure elements 214-1, 214-2 on the insulation layer 212 of the metallization layer stack 206, a planar cover layer arrangement 220 being arranged on the sensor structure 214, and furthermore a moisture-absorbing layer element 232 on the planar cover layer stack 220 covering the sensor structure 214. The planar cover layer arrangement 220 furthermore comprises a second cover layer 216 or, as a layer stack, a second and third cover layer 216, 218 on the sensor structure 214.

According to one exemplary embodiment, the planar cover layer arrangement 220 comprises the first cover layer 216, which covers the conductive sensor structure 214, a section, covering the conductive sensor structure 214, of the first cover layer 216 being configured in a planar fashion in order to form the planar cover layer arrangement 220.

According to a further exemplary embodiment, the planar cover layer arrangement 220 comprises a second and third cover layer 216, 218 on the sensor structure 214, in order to obtain the planar cover layer arrangement 220 as a planar cover layer stack 220 having the first and second cover layers 216, 218 on the sensor structure 214, a material of the first cover layer being arranged in an intermediate region between the neighboring conductive sensor structure elements 214-1, 214-2 of the sensor structure, or the intermediate space between neighboring conductive sensor structure elements 214-1, 214-2 of the sensor structure 214 being left free as a cavity region.

As is represented by way of example in FIG. 4a, the moisture sensor 300 comprises the material of the first cover layer 216 in an intermediate region between the neighboring conductive sensor structure elements 214-1, 214-2 of the sensor structure 214.

As is represented by way of example in FIG. 4b, the moisture sensor 300' comprises the intermediate region is left free is as a cavity region 234 between the neighboring conductive sensor structure elements 214-1, 214-2 of the sensor structure 214.

According to one exemplary embodiment, the moisture sensor 300, 300' furthermore comprises a passivation layer arrangement on the planar cover layer arrangement 220 covering the layer structure.

According to one exemplary embodiment, the moisture sensor 300, 300' furthermore comprises a third cover layer 222 on uncovered regions of the insulation layer 212 and of the planar cover layer arrangement 220 of the sensor structure 214.

According to one exemplary embodiment, the moisture sensor 300, 300' comprises a reference electrode structure 215 having a multiplicity of reference structure elements 215-1, 215-2 on the insulation layer 212.

According to one exemplary embodiment, the reference electrode structure is embedded in the third cover layer. According to one exemplary embodiment, the reference electrode structure is configured as a metallization structure embedded in the metallization layer stack 206.

According to one exemplary embodiment, the metallization layer stack 206 comprises next to the sensor structure 214 a metallization structure 210-1, which is configured as a shielding element for the sensor structure 214 in order to reduce a parasitic capacitance.

The sensor region of the moisture sensor 300' will now be described below with the aid of FIG. 5 in the form of a schematic cross-sectional view with a basic representation of the resulting components of the acting electric field.

Figure 5:
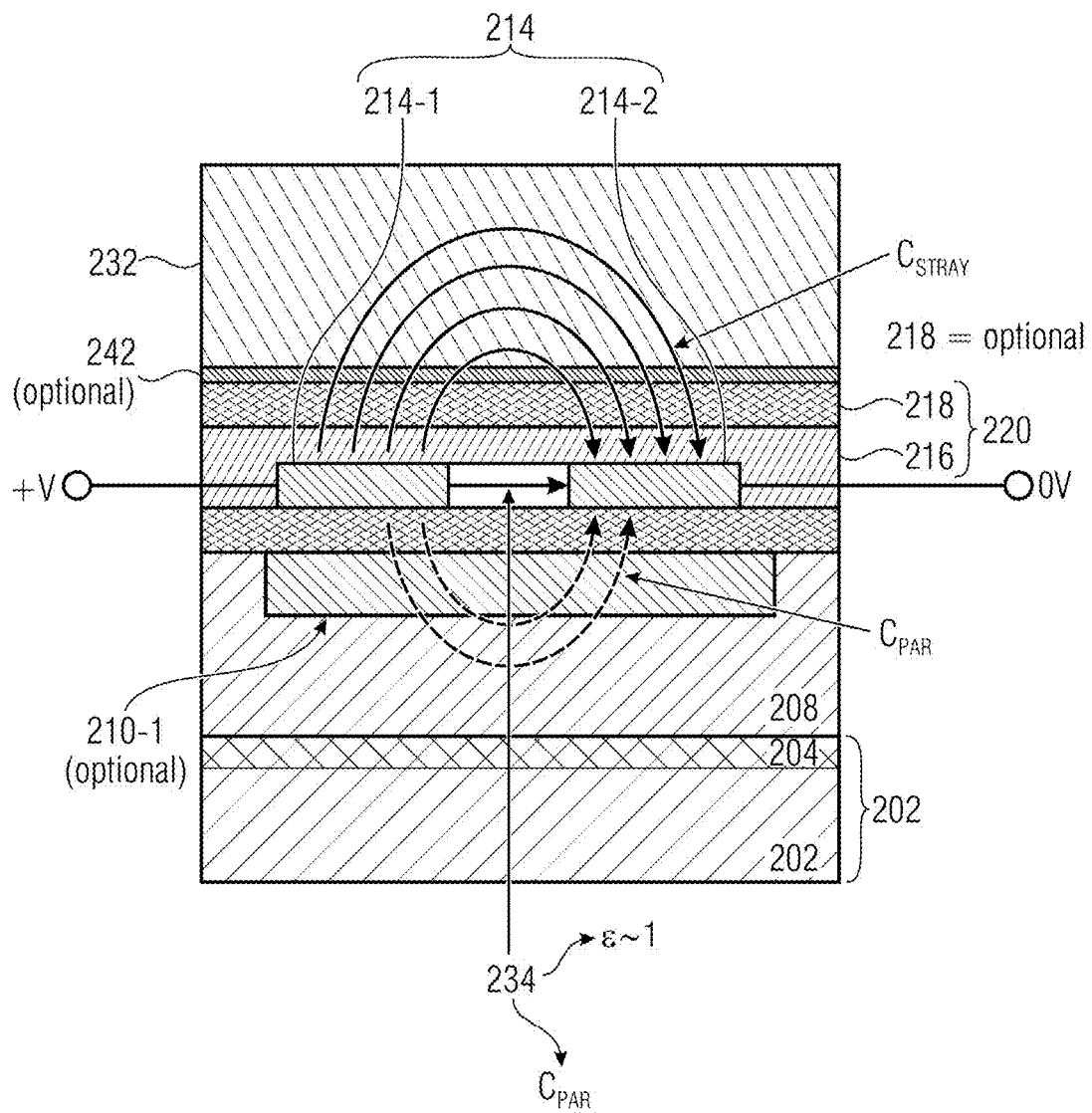
FIG. 5 shows a schematic cross-sectional representation of the sensor region of the moisture sensor with a basic representation of the resulting components of the electric field according to one exemplary embodiment.

As is represented in FIG. 5, the conductive sensor structure 214 comprises the multiplicity of sensor structure elements 214-1, 214-2 on the first cover layer 212 of the metallization layer stack 206, a planar cover layer arrangement 220 being arranged on the conductive sensor structure 214. Furthermore, the moisture-absorbing layer element 232 is arranged on the planar cover layer arrangement 220 covering the conductive sensor structure. As is furthermore represented by way of example in FIG. 5, the intermediate regions between the sensor structure elements 214-1, 214-2 are configured as cavities 234, the metallization structure 210-1 effective as a shielding element furthermore being arranged next to the conductive sensor structure 214 in the metallization layer stack 206.

During operation of the moisture sensor 300', a potential difference with a voltage of +V relative to 0 volts is for example now applied between the sensor structure elements 214-1, 214-2 of the conductive sensor structure 240. The resulting electric field, or stray field, respectively propagates perpendicularly out from the first sensor structure element 214-1 and perpendicularly back into the second sensor structure element 214-2 and with a field line density corresponding to the potential difference between the two sensor structure elements 214-1, 214-2.

The component of the overall field which passes through the moisture-absorbing layer element 232 is referred to as the stray field. In other words, the overall capacitance $C_{GES}$ of the sensor structure 214 is given by the sum of the stray capacitance $C_{STRAY}$ and the parasitic capacitance $C_{PAR}$.

The electric field lines passing through the moisture-absorbing layer element 232 now contribute to the stray capacitance $C_{STRAY}$ and therefore to the measurement signal. The change in the overall capacitance $\Delta C_G$ is now a function of the relative humidity, or the change in the relative humidity, which has been absorbed in the moisture-absorbing layer element 232. The signal-to-noise ratio (SNR) of the moisture sensor 300, 300' is now proportional to the ratio between the change in the overall capacitance $\Delta C_G$ to the overall capacitance $C_G$.

The signal-to-noise ratio is therefore all the greater, the smaller the parasitic capacitance $C_{PAR}$ can be kept. The parasitic capacitance may, for example, be reduced by producing the cavities 234 with a material, such as for example air, having a relatively low relative dielectric constant $\varepsilon_r$, the relative dielectric constant of air being about 1 ($\varepsilon_r \approx 1$).

Furthermore, the metallization structure 210-1 may contribute to further reducing the parasitic capacitance CPAR since the electric field lines emerging from the sensor structure element 214-1 in the direction of the metallization structures 210-1 are short-circuited inside the metallization structure 210-1 on the way to the second sensor structure element 214-2, i.e. they cover only a small fraction of the path inside the insulation layer 212, and can therefore be reduced further, i.e. compared with a case in which the conductive layer structure 210-1 is not formed.

Aspects of the present methods 100, 100' for producing a moisture sensor 300, 300' at the wafer level will be further discussed below.

According to a first aspect of the present method for producing a moisture sensor at the wafer level, an e.g. one-layer planar passivation layer (=first cover layer) is formed above the sensor structure, formed for example as an interdigital structure or capacitive measurement structure, of the moisture sensor. The e.g. one-layer planar passivation layer (first cover layer) is relatively simple to produce in the process sequence and may be integrated very well into previous process sequences. The moisture-absorbing layer of the moisture sensor may be applied extremely simply onto the extremely planar passivation layer above the sensor structure elements or interdigital structure (and a second cover layer arranged thereon, which is provided for example as an etch stop layer during the production method), since there is no topology or surface unevenness.

According to a second aspect of the present method for producing a moisture sensor at the wafer level, an (at least) two-layer passivation layer arrangement is arranged on or above the sensor structure configured as an interdigital structure, one of the passivation layers being configured as a sacrificial layer in order to obtain a hollow space, or a cavity, between opposite sensor structure elements, for example between opposite finger elements of the interdigital structure, after at least local removal of the sacrificial layer. The moisture-absorbing layer of the moisture sensor may be applied extremely simply onto the extremely planar passivation layer arrangement above the sensor structure elements or interdigital structure (and a second cover layer arranged thereon, which is provided for example as an etch stop layer during the production method), since there is no or only a small topology or surface unevenness.

In the hollow space (or the hollow spaces or cavities), a relative dielectric constant $\varepsilon_r \approx 1$ of air may then be assumed. The "ineffective" component of the electric field may therefore be minimized, the ineffective component of the electric field, or of the electric field lines, being regarded as the component which does not pass through the moisture-absorbing layer.

By the provision of hollow spaces, or cavities, according to the second aspect between neighboring sensor structure elements in the passivation layer arrangement covering the measurement structure, the measurement results of the sensor structure may be improved further since the ineffective component of the electric field, or of the electric field lines, which does not pass through the moisture-absorbing material, can be minimized. Since a relative dielectric constant $\varepsilon_r$ of about 1 can be assumed in the hollow spaces, the parasitic capacitance of the measurement capacitance can be kept relatively low and the signal-to-noise ratio (SNR) in the output signal of the sensor structure can therefore be increased significantly compared with conventional approaches.

The sacrificial material used may, besides very many different suitable sacrificial materials, comprise for example carbon, which may be ashed with oxygen. In the second aspect of the production method, the upper side of the hollow space may have an offset $\Delta x$ with respect to the surface of the electrode structures, so that for example a residual topology remains on the upper passivation layer, onto which the moisture-absorbing material is then applied.

Both aspects of the present method for producing a moisture sensor at the wafer level may be introduced very simply into existing CMOS process sequences, the sensor structure elements, arranged for example as an interdigital structure, with the one-layer or two-layer passivation layer arrangement arranged thereon, which is configured in a relatively planar fashion above the interdigital structure, being produced. This passivation layer arrangement is then structured, at least the sections of the passivation layer arrangement which cover the sensor structure elements being preserved. This structured passivation layer arrangement is then preserved ("interim parked") during the further process steps for the moisture sensor, or further circuit elements on the BEOL stack, i.e. the substrate arrangement, with the CMOS circuit arrangement until the planar passivation layer arrangement (and the second cover layer arranged thereon, which is provided for example as an etch stop layer during the production method, and which with the planar passivation layer arrangement forms the planar cover layer arrangement, or the planar cover layer stack) is exposed again on the interdigital structure and then the measurement layer, i.e. the moisture-absorbing layer element, is applied in order finally to form the moisture sensor.

Both aspects of the present method for producing a moisture sensor at the wafer level are surface-neutral, since the moisture sensor may for example be arranged above regions with CMOS logic in the semiconductor substrate which are present anyway.

Furthermore, a reference capacitance or reference electrode structure may be provided in order to be able to compensate effectively for possible perturbing cross-influences in the case of interconnection of the measurement capacitance with the reference capacitance to form a Wheatstone bridge.

The production of the sensor structure is thus, for example, carried out in such a way that the moisture-sensitive electrodes and the moisture-insensitive reference electrodes are produced inside the same process module, after the standard CMOS metallization process step and before carrying out the pad fabrication module.

According to exemplary embodiments of the present method for producing a moisture sensor at the wafer level, the sensor structure elements may be integrated monolithically with the application-specific integrated circuit arrangement (ASIC) on the same semiconductor substrate. Furthermore, the sensor structure elements of the moisture sensor and the ASIC may be produced within a commonly employed process sequence, or process flow. In this case, the sensor structure elements may be embedded inside a dielectric material (the passivation layer arrangement and the second cover layer, i.e. the cover layer stack, optionally arranged thereon). The dielectric material of the passivation layer is for example planarized, for example by means of a CMP process (CMP=chemical-mechanical polishing), which exposes a flat surface region of the passivation layer without relevant topology. The moisture-sensitive material is then applied on the upper side of the planar cover layer arrangement covering the sensor structure, or the cover layer stack (=passivation layer and the second cover layer arranged thereon).

Furthermore, according to the present method, reference electrode structures without moisture sensitivity may be produced simultaneously in a parallel fashion in order to produce the measurement sensor structure elements, for example in order to form a capacitive bridge circuit (Wheatstone bridge) with the capacitive measurement and reference electrode structures.

According to exemplary embodiments, both components of the signal generation, i.e. the moisture sensor 300, 300', and of the signal processing for processing the sensor signals, for example in the form of the FEOL components 204, are available on the same chip. Furthermore, the moisture sensor 300, 300' may be integrated economically into existing sensor systems or sensor solutions, in order for example to form multi-sensor systems. In particular, an integrated production process or production sequence may be carried out for the moisture sensor with the associated CMOS-ASIC, in which case production processes may be used together. Furthermore, a thin planarized cover layer or passivation layer or layer structure on the sensor electrodes (sensor structure elements) permits a high signal yield and therefore accuracy of the moisture sensor 300. Furthermore, the moisture sensor 300 at the wafer level may be arranged on the metallization layer stack 206 above active circuit regions of the FEOL components 204, so that available chip surface may be used. In this case, the term "sensor-over-active" sensor arrangement is used.

According to one exemplary embodiment, a method 100, 100' for producing a moisture sensor 300, 300' at the wafer level comprises the following steps: providing 105 a substrate arrangement 200, which comprises a semiconductor substrate 202 and a metallization layer stack 206 arranged on the semiconductor substrate 202, the metallization layer stack 206 comprising a multiplicity of metallization structures 210, 210-1 embedded in an insulation material 208, an insulation layer 212 being arranged on the metallization layer stack 206, applying no a sensor structure 214 having a multiplicity of conductive sensor structure elements 214-1, 214-2 on the insulation layer 212 of the metallization layer stack 206, applying 115 a first cover layer 216 on the sensor structure 214 and uncovered sections of the insulation layer 212, the first cover layer 216 covering the conductive sensor structure 214, and a section, covering the conductive sensor structure 214, of the first cover layer 216 being configured in a planar fashion in order to form a planar cover layer arrangement 220, locally removing 125 the planar cover layer arrangement 220, the sensor structure 214 remaining covered with the planar cover layer arrangement 220, applying 130 a third cover layer 222 on the exposed insulation layer 212 and the planar cover layer stack 220 covering the sensor structure 214, exposing 135 the planar cover layer arrangement 220 covering the sensor structure 214, and applying 145 a moisture-absorbing layer element 232 on the planar cover layer arrangement 220 covering the sensor structure, in order to obtain the moisture sensor 300.

According to a further exemplary embodiment, the method 100 furthermore comprises the following step: applying 120 a second cover layer 218 on the planar first cover layer 216, in order to obtain the planar cover layer arrangement 220 as a planar cover layer stack 220 having the first and second cover layers 216, 218 on the sensor structure 214.

According to a further exemplary embodiment, the method 100 furthermore comprises the following step: planarizing the first cover layer, in order to form at least the section 216-1, covering the sensor structure 214, of the first cover layer 216 in a planar fashion.

According to a further exemplary embodiment, the method 100' furthermore comprises the following step: arranging a sacrificial layer structure 217 between the neighboring sensor structure elements 214-1, 214-2 of the sensor structure 214 after the application of the first cover layer 216, in order to obtain a cavity region 234 between the neighboring sensor structure elements 214-1, 214-2 of the sensor structure 214.

According to a further exemplary embodiment, the method 100, 100' furthermore comprises the following step: applying 140 a passivation layer arrangement onto the planar cover layer arrangement 220 covering the sensor structure 214, the step 135 of exposing the planar cover layer arrangement 220 covering the sensor layer structure 214 being carried out through the passivation layer arrangement and the third cover layer 222.

According to a further exemplary embodiment, during the application 110 of the sensor structure 214 having a multiplicity of conductive sensor structure elements 214-1, 214-2, a reference electrode structure 215 having a multiplicity of conductive reference structure elements 215-1, 215-2 is furthermore applied on the insulation layer 212.

According to a further exemplary embodiment, the reference electrode structure 215 is embedded in the third cover layer after the application of the third cover layer.

According to a further exemplary embodiment, the reference electrode structure 215 is formed as a metallization structure embedded in the metallization layer stack.

According to a further exemplary embodiment, the metallization layer stack 206 comprises next to the sensor structure 214 a metallization structure 210-1, which is configured as a shielding element for the sensor structure 214 in order to reduce a parasitic capacitance.

According to a further exemplary embodiment, the method 100, 100' furthermore comprises the following step after the application of the third cover layer 222: applying further insulation layer structures, metallization layer structures and/or component structures on one another or on the third cover layer 222.

According to a further exemplary embodiment, during the step of applying further insulation structures, metallization layer structures and/or component structures, a rewiring layer, an insulation layer, an uppermost metallization layer and/or a passivation layer arrangement are applied and structured in such a way that the planar cover layer arrangement 220 covering the sensor structure 214 is exposed.

According to a further exemplary embodiment, the moisture-absorbing layer element 232 comprises a polymer material.

According to a further exemplary embodiment, the sensor structure elements 214-1, 214-2 of the sensor structure 214 comprise copper or aluminum with a thickness of 500 nm or about 200 nm and a lateral spacing of about 100 nm.

According to a further exemplary embodiment, the sensor structure elements 214-1, 214-2 are arranged in an interdigital arrangement with respect to one another.

According to a further exemplary embodiment, the components 204 arranged on the semiconductor substrate 202 are formed during an FEOL treatment process of the semiconductor substrate 202.

According to a further exemplary embodiment, the FEOL components comprise components based on CMOS technology.

According to a further exemplary embodiment, the metallization layer stack 206 is formed during a BEOL treatment process of the substrate arrangement 200.

According to a further exemplary embodiment, the metallization layer stack 206 comprises a multiplicity of conductive track structures 210 in different planes $M_{\#}$. in the insulation material 208.

According to a further exemplary embodiment, a moisture sensor 300 comprises the following features: a substrate arrangement 200, which comprises a semiconductor substrate 202 having components 204 arranged thereon and a metallization layer stack 206 arranged on the semiconductor substrate 202, the metallization layer stack 206 comprising a multiplicity of metallization structures embedded in an insulation material 208, an insulation layer 212 being arranged on the metallization layer stack 206 of the substrate arrangement 200, a sensor structure 214 having a multiplicity of conductive sensor structure elements 214-1, 214-2 on the insulation layer 212 of the metallization layer stack 206, a planar cover layer arrangement 220 being arranged on the sensor structure 214, and a moisture-absorbing layer element 232 on the planar cover layer stack 220 covering the sensor structure 214.

According to a further exemplary embodiment, the planar cover layer arrangement 220 comprises a first cover layer 216, which covers the conductive sensor structure 214, and a section, covering the conductive sensor structure 214, of the first cover layer 216 is configured in a planar fashion in order to form the planar cover layer arrangement 220.

According to a further exemplary embodiment, the planar cover layer arrangement 220 furthermore comprises a second and a third cover layer 216, 218 on the sensor structure 214, in order to obtain the planar cover layer arrangement 220 as a planar cover layer stack 220 having the first and second cover layers 216, 218 on the sensor structure 214, a material of the first cover layer being arranged in an intermediate region between the neighboring conductive sensor structure elements 214-1, 214-2 of the sensor structure, or the intermediate space between neighboring conductive sensor structure elements 214-1, 214-2 of the sensor structure 214 being left free as a cavity region.

According to a further exemplary embodiment, a passivation layer arrangement is furthermore arranged on the planar cover layer arrangement 220 covering the layer structure.

According to a further exemplary embodiment, a third cover layer 222 is furthermore arranged on uncovered regions of the insulation layer 212 and of the planar cover layer arrangement 220 of the sensor structure 214.

According to a further exemplary embodiment, the moisture sensor 300 furthermore comprises the following feature: a reference electrode structure 215 having a multiplicity of reference structure elements 215-1, 215-2 on the insulation layer 212.

According to a further exemplary embodiment, the reference electrode structure is embedded in the third cover layer.

According to a further exemplary embodiment, the reference electrode structure is formed as a metallization structure embedded in the metallization layer stack 206.

According to a further exemplary embodiment, the metallization layer stack 206 comprises next to the sensor structure 214 a metallization structure 210-1, which is configured as a shielding element for the sensor structure 214 in order to reduce a parasitic capacitance.

Although some aspects of the present disclosure have been described as features in connection with a device, it is clear that such a description may likewise be regarded as a description of corresponding method features. Although some aspects have been described as features in connection with a method, it is clear that such a description may also be regarded as a description of corresponding features of a device, or of the functionality of a device.

In the detailed description above, various features have sometimes been grouped together in examples in order to rationalize the disclosure. This type of disclosure should not be interpreted as meaning that the claimed examples comprise more features than are explicitly specified in each claim. Rather, as the following claims reflect, the subject-matter may reside in fewer than all the features of an individual disclosed example. Consequently, the following claims are hereby included in the detailed description, wherein each claim may stand as an individual separate example. While each claim may stand as an individual separate example, it should be noted that, although dependent claims in the claims refer back to a specific combination with one or more other claims, other examples also comprise a combination of dependent claims with the subject-matter of any other dependent claim or a combination of any feature with other dependent or independent claims. Such combinations are to be included unless it is mentioned that a specific combination is not intended. It is furthermore intended that a combination of features of one claim with any other independent claim is also included, even if this claim is not directly dependent on the independent claim.

Although specific exemplary embodiments have been presented and described herein, it will be clear to a person skilled in the art that many alternative and/or equivalent implementations may be substituted for the exemplary embodiments specifically shown and presented there, without departing from the subject-matter of the present application. This application text is intended to cover all adaptations and variations of the specific exemplary embodiments described and discussed herein. The present application subject-matter is therefore limited only by the wording of the claims and the equivalent embodiments thereof.

What is claimed is:

1. A method for producing a moisture sensor at a wafer level, the method comprising:
   providing a substrate arrangement, which comprises a semiconductor substrate and a metallization layer stack arranged on the semiconductor substrate, the metallization layer stack comprising a multiplicity of metallization structures embedded in an insulation material, an insulation layer being arranged on the metallization layer stack,
   applying a sensor structure, wherein the sensor structure has a multiplicity of conductive sensor structure elements on the insulation layer of the metallization layer stack,
   applying a first cover layer on the sensor structure and on uncovered sections of the insulation layer, the first cover layer covering the conductive sensor structure, wherein a section of the first cover layer covering the conductive sensor structure is configured in a planar fashion in order to form a planar cover layer arrangement,
   locally removing the planar cover layer arrangement to expose portions of the insulation layer, wherein the sensor structure remains covered with the planar cover layer arrangement,
   applying a third cover layer on the exposed portions of the insulation layer and on the planar cover layer stack covering the sensor structure,
   exposing the planar cover layer arrangement covering the sensor structure, and
   applying a moisture-absorbing layer element on the planar cover layer arrangement covering the sensor structure to obtain the moisture sensor.

2. The method as claimed in claim 1, further comprising:
   applying a second cover layer on the section of the first cover layer configured in the planar fashion to obtain the planar cover layer arrangement as a planar cover layer stack having the first and second cover layers on the sensor structure.

3. The method as claimed in claim 1, further comprising:
   planarizing the first cover layer to form at least the section of the first cover layer covering the sensor structure in the planar fashion.

4. The method as claimed claim 1, further comprising:
   arranging a sacrificial layer structure between neighboring sensor structure elements of the sensor structure after applying of the first cover layer to obtain a cavity region between neighboring sensor structure elements of the sensor structure.

5. The method as claimed in claim 1, further comprising:
   applying a passivation layer arrangement onto the planar cover layer arrangement covering the sensor structure, wherein the step of exposing the planar cover layer arrangement covering the sensor structure is carried out through the passivation layer arrangement and the third cover layer.

6. The method as claimed in claim 1, further comprising applying a reference electrode structure having a multiplicity of conductive reference structure elements on the insulation layer during the applying of the sensor structure having the multiplicity of conductive sensor structure elements.

7. The method as claimed claim 1, further comprising applying further insulation layer structures, metallization layer structures and/or component structures on one another or on the third cover layer after the applying the third cover layer.

8. The method as claimed in claim 7, wherein during the step of applying further insulation structures, metallization layer structures or component structures, a rewiring layer, a further insulation layer, an uppermost metallization layer or a passivation layer arrangement is applied and structured to expose the planar cover layer arrangement covering the sensor structure.

9. The method as claimed in claim 1, wherein:
components arranged on the semiconductor substrate are formed during an FEOL treatment process of the semiconductor substrate; and
the metallization layer stack is formed during a BEOL treatment process of the substrate arrangement.

10. The method as claimed in claim 1, wherein the metallization layer stack comprises a multiplicity of conductive tracks structures in different planes in the insulation material.

11. A moisture sensor comprising:
a semiconductor substrate with components arranged thereon,
a metallization layer stack arranged on the semiconductor substrate, the metallization layer stack comprising a multiplicity of metallization structures embedded in an insulation material,
an insulation layer arranged on the metallization layer stack,
a sensor structure having a multiplicity of conductive sensor structure elements on the insulation layer of the metallization layer stack,
a planar cover layer arrangement being arranged on the sensor structure, and
a moisture-absorbing layer element on the planar cover layer stack covering the sensor structure.

12. The moisture sensor as claimed in claim 11, wherein the planar cover layer arrangement comprises a first cover layer covering the conductive sensor structure, wherein a section of the first cover layer, covering the conductive sensor structure is configured in a planar fashion in order to form the planar cover layer arrangement.

13. The moisture sensor as claimed in claim 12, wherein the planar cover layer arrangement further comprises a second cover layer and a third cover layer on the sensor structure to obtain the planar cover layer arrangement as a planar cover layer stack having the first and second cover layers on the sensor structure, wherein a material of the first cover layer being arranged in an intermediate region between neighboring conductive sensor structure elements of the sensor structure, or the intermediate region between the neighboring conductive sensor structure elements of the sensor structure is left free as a cavity region.

14. The moisture sensor as claimed in claim 11, wherein a passivation layer arrangement is further arranged on the planar cover layer arrangement.

15. The moisture sensor as claimed in claim 11, wherein a third cover layer is further arranged on uncovered regions of the insulation layer and of the planar cover layer arrangement of the sensor structure.

16. The moisture sensor as claimed claim 11, further comprising a reference electrode structure having a multiplicity of reference structure elements on the insulation layer.

17. The moisture sensor as claimed in claim 16, wherein the reference electrode structure is embedded in a third cover layer, the third cover layer arranged on uncovered regions of the insulation layer and of the planar cover layer arrangement of the sensor structure.

18. The moisture sensor as claimed in claim 16, wherein the reference electrode structure comprises a metallization structure of the multiplicity of metallization structures embedded in the metallization layer stack.

19. The moisture sensor as claimed in claim 11, wherein a metallization structure of the multiplicity of metallization structures of the metallization layer stack is next to the sensor structure, the metallization structure configured as a shielding element for the sensor structure to reduce a parasitic capacitance.

20. The moisture sensor as claimed in claim 11, wherein the moisture-absorbing layer element comprises a polymer material.

21. The moisture sensor as claimed in claim 11, wherein the sensor structure elements of the sensor structure comprise copper or aluminum with a thickness of ≤500 nm.

22. The moisture sensor as claimed in claim 21, wherein the sensor structure elements are arranged in an interdigitated fashion with respect to one another.

23. A moisture sensor comprising:
a semiconductor substrate;
an first insulation layer disposed on the semiconductor substrate;
a first conductive structure and a second conductive structure embedded in the first insulation layer;
a second insulation layer disposed over the first insulation layer;
a plurality of conductor sensor elements disposed over the second insulation layer and over the first conductive structure;
a plurality of reference electrodes disposed over the second insulation layer and over the second conductive structure;
a planar first cover layer disposed over the plurality of conductive sensor elements and a second cover layer disposed over the plurality of reference electrodes; and
moisture absorbing material disposed over the planar cover layer and over the plurality of conductive sensor elements.

* * * * *